(12) United States Patent
Tanaka et al.

(10) Patent No.: US 8,067,523 B2
(45) Date of Patent: Nov. 29, 2011

(54) THERMOSETTING RESIN COMPOSITION, LAMINATED BODY USING IT, AND CIRCUIT BOARD

(75) Inventors: Shigeru Tanaka, Settsu (JP); Kanji Shimoohsako, Settsu (JP); Takashi Ito, Otsu (JP); Mutsuaki Murakami, Settsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 11/542,229

(22) Filed: Oct. 4, 2006

(65) Prior Publication Data

US 2007/0074896 A1 Apr. 5, 2007

Related U.S. Application Data

(63) Continuation-in-part of application No. PCT/JP2005/006897, filed on Apr. 8, 2005.

(30) Foreign Application Priority Data

Apr. 19, 2004 (JP) ................................. 2004-123266

(51) Int. Cl.
*C08G 65/00* (2006.01)
(52) U.S. Cl. ............ 528/120; 528/94; 528/99; 528/100; 528/125; 528/310
(58) Field of Classification Search .................. 528/310, 528/125, 126, 94, 99, 120
See application file for complete search history.

(56) References Cited

U.S. PATENT DOCUMENTS

| 4,585,852 A * | 4/1986 | Lo et al. ..................... 528/185 |
| 6,294,259 B1 * | 9/2001 | Anderson et al. ............. 428/413 |

FOREIGN PATENT DOCUMENTS

| EP | 0 309 190 A2 | 3/1989 |
| EP | 0 379 131 A2 | 7/1990 |
| EP | 0 379 467 A2 | 7/1990 |
| EP | 1 193 280 A1 | 4/2002 |
| JP | 02-252735 A | 10/1990 |
| JP | 4-81421 A | 3/1992 |
| JP | 2002-47472 A | 2/2002 |
| WO | WO 02/04572 A1 | 1/2002 |

OTHER PUBLICATIONS

International Search Report of PCT/JP2005/006897, date of mailing Jul. 19, 2005.
Notification of Transmittal of Translation of the International Preliminary Report on Patentability (Form PCT/IB/338) of International Application No. PCT/JP2005/006897 mailed Nov. 2, 2006 with Forms PCT/IB/373 and PCT/ISA/237.

* cited by examiner

*Primary Examiner* — James J Seidleck
*Assistant Examiner* — Gregory Listvoyb
(74) *Attorney, Agent, or Firm* — Westerman, Hattori, Daniels & Adrian, LLP

(57) ABSTRACT

It is an object of the present invention to provide a thermosetting resin composition having satisfactory adhesiveness, good processability, high heat resistance, and excellent dielectric characteristics in the GHz band; and a laminate and a circuit board including the thermosetting resin composition.

The present invention provides a thermosetting resin composition including an imide oligomer component (A) containing at least one imide oligomer having a specific structure and an epoxy resin component (B) containing at least one epoxy resin. Furthermore, the present invention provides the thermosetting resin composition further including a polyimide resin component (C).

12 Claims, No Drawings

THERMOSETTING RESIN COMPOSITION, LAMINATED BODY USING IT, AND CIRCUIT BOARD

RELATED APPLICATION

This application is a Continuation-in-Part of PCT application PCT/JP2005/006897 filed on Apr. 8, 2005, claiming priority based on Japanese Application No. 2004-123266 filed on Apr. 19, 2004, the contents of which are incorporated herein by reference in their entirety.

TECHNICAL FIELD

The present invention relates to thermosetting resin compositions, laminated body using it, and circuit Board that are used for, for example, the manufacture of circuit boards such as flexible printed circuit boards and build-up circuit boards. In particular, the present invention relates to a thermosetting resin composition containing an epoxy resin and an imide oligomer having a group reactive with an epoxy resin, and relates to a laminate and a circuit board including the thermosetting resin composition.

BACKGROUND ART

In recent years, to improve information-processing capability in electronic devices, frequencies of electrical signals transmitted through circuits on circuit boards used in the electronic devices have been increased to high frequency level. Therefore, even when the frequencies of the electrical signals are increased, the wiring (circuit) boards are required to maintain electrical reliability and suppress a decrease in electrical signal transmission rate and loss of electrical signals in the circuit.

Insulating layers, such as a protective film for protecting the circuit board and the circuit and an interlayer insulating film for ensuring insulation between layers constituting a multilayer circuit board, are usually provided on the above-described circuit board. The insulating layers such as the protective film and the interlayer insulating film are provided on the circuit board and thus have been required to have adhesiveness to the circuit board in addition to insulation properties.

In particular, when a multilayer circuit board, such as a build-up circuit board, is produced by lamination, the layers are bonded together with the interlayer insulating layer provided therebetween and fixed. At the same time, the space between lines in the circuit wiring are filled with a material constituting the interlayer insulating layer, thus fixing the lines. Therefore, the interlayer insulating film is required to have satisfactory adhesiveness to a substrate and the like and flowability such that the gaps between the lines in the circuit wiring are filled with the interlayer insulating film. Consequently, the insulating layers, such as the protective film and the interlayer insulating film, are composed of adhesive materials having adhesiveness and resin flowability.

Furthermore, in order to improve information-processing capability in electronic devices by increasing frequencies of electrical signals, even when insulating layers are composed of adhesive materials, the circuit boards are required to maintain electrical reliability in the gigahertz (GHz) band and have no adverse effect on the electrical signal transmission.

Conventionally, for example, epoxy adhesive materials and thermoplastic polyimide adhesive materials have been used as adhesive materials for circuit boards. The epoxy adhesive materials have satisfactory processability, i.e., the epoxy adhesive materials can bond adherends under low-temperature and low-pressure conditions and can fill the space between lines in circuit wiring. In addition, the epoxy adhesive materials have satisfactory adhesiveness to adherends. The thermoplastic polyimide adhesive materials have dielectric constants and dielectric loss tangents lower than those of epoxy resins and thus can be used in higher-frequency applications. Furthermore, the thermoplastic polyimide adhesive materials have, for example, satisfactory insulation (e.g., low volume resistivity) and excellent heat resistance (e.g., low thermal expansion and high thermal decomposition temperature).

Patent Document 1 discloses an adhesive being in the form of a film and composed of a mixture of a polyimide resin having a glass transition temperature within a predetermined range, an epoxy compound, and a compound having an active hydrogen group that can react with the epoxy compound, as a material containing the epoxy resin and polyimide resin described above, and this adhesive allowing bonding of adherends at a low temperature in a short time and ensuring reliability of heat resistance at a high temperature.

Patent Document 2 discloses a sealing epoxy resin composition containing an epoxy resin, a phenolic resin curing agent, a specific imide oligomer, and an inorganic filler.

Patent Document 3 discloses a hybrid adhesive composition containing an imide oligomer containing a specific repeating unit structure, an epoxy resin, and an epoxy curing agent.

[Patent Document 1] Japanese Unexamined Patent Application Publication No. 8-27430 (publication date: Jan. 30, 1996 (Heisei 8))

[Patent Document 2] Japanese Unexamined Patent Application Publication No. 08-41172

[Patent Document 3] PCT Japanese Translation Patent Publication No. 2004-502859

DISCLOSURE OF INVENTION

Problems to be Solved by the Invention

However, an epoxy resin prepared by curing the above-described epoxy adhesive material has a dielectric constant of 4 or more and a dielectric loss tangent of 0.02 or more in the gigahertz (GHz) band; hence, satisfactory dielectric characteristics are not achieved.

On the contrary, a polyimide resin prepared by curing the above-described thermoplastic polyimide adhesive material has satisfactory heat resistance and excellent insulation. However, to bond adherends with the thermoplastic polyimide adhesive material, it is necessary to bond the adherends under high-temperature and high-pressure conditions. That is, there is a problem with processability.

The film adhesive disclosed in Patent Document 1 can be used for bonding adherends at a low temperature in a short time and has satisfactory reliability of heat resistance at a high temperature. However, its ability (resin flowability) to fill the space between lines in circuit wiring and dielectric characteristics are not described. The epoxy compound in the adhesive being in the form of a film disclosed in Patent Document 1 lowers the softening temperature of the film adhesive to improve processability at a low temperature, whereas the high content of the epoxy compound disadvantageously has a higher dielectric constant and a dielectric loss tangent, thus causing degradation of the dielectric characteristics.

Therefore, to improve information-processing capability in electronic devices by using high-frequency electrical signals, the developments of adhesive materials having satisfactory adhesiveness, processability, resin flowability, and heat resistance and capable of forming insulating layers exhibiting excellent dielectric characteristics (low dielectric constant and low dielectric loss tangent) even in the GHz band, are desired.

On the other hand, in Patent Document 2, an imide oligomer having a structure specified in the present invention is not described. A resin composition used for sealing electronic components such as semiconductors is disclosed, and the characteristics, such as adhesiveness, flowability, and dielectric characteristics, of the resin composition are not described.

In Patent Document 3, an imide oligomer having a specific structure according to the present invention is not described. A resin composition used for adhesives used in electronic industry, for example, adhesives for flip chips and anisotropic conductive adhesives and sealing agents for electronic components, is described, and the dielectric characteristics, coefficient of thermal expansion (CTE), and the like of the resin composition are not described.

The present invention is made to solve the conventional problems described above. It is an object of the present invention to provide a thermosetting resin composition suitably used in producing a circuit board such as a flexible printed circuit board or a build-up circuit board, and having satisfactory adhesiveness, good processability, high heat resistance, superb resin flowability, and excellent dielectric characteristics in the GHz band; and a laminate and a circuit board including using it.

Means for Solving the Problems

As a result of intensive research, the present inventors found that a thermosetting resin composition essentially containing an imide oligomer having a group that can react with an epoxy resin and an epoxy resin has satisfactory adhesiveness to an adherend such as a circuit board, excellent heat resistance with respect to thermal expansion and thermal decomposition, and the specifically improved flowability required for embedding a circuit, and also found that a cured resin prepared by curing the thermosetting resin composition has excellent dielectric characteristics (low dielectric constant and low dielectric loss tangent in the GHz band). The findings resulted in completion of the present invention.

To solve the problems, a thermosetting resin composition of the present invention includes an imide oligomer component (A) containing at least one imide oligomer represented by general formula (1):

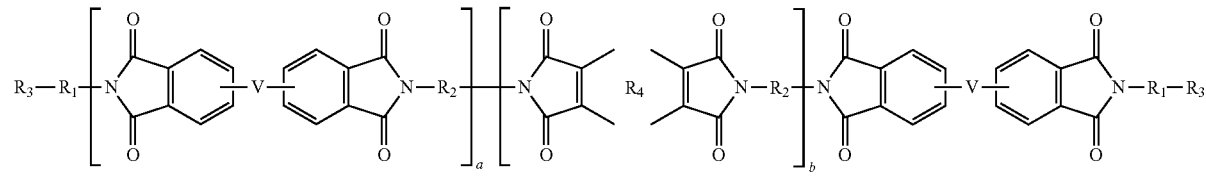

(1)

(wherein $R_1$s may be the same or different, and $R_1$s each represent a divalent organic group containing at least one aromatic ring; $R_2$s may be the same or different, and $R_2$s each represent a divalent organic group containing at least two aromatic rings; $R_3$s may be the same or different, and $R_3$s each represent a monovalent organic group selected from —OH and —$NH_2$; $R_4$s may be the same or different, and $R_4$s each represent a tetravalent organic group containing at least one aromatic ring; V represents a direct bond or a divalent group selected from the group consisting of —O—, —CO—, —O-T-O—, —COO-T-OCO—, —$C(CH_3)_2$—, and —$C(CF_3)_2$—; T represents a divalent organic group; a and b independently represent an integer of 0 to 15; a+b represents an integer of 0 to 15; and the compound represented by general formula (1) may be a block copolymer or a random copolymer) or general formula (2):

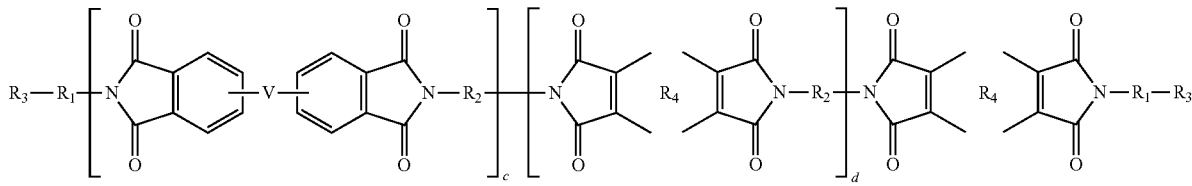

(2)

(wherein $R_1$s may be the same or different, and $R_1$s each represent a divalent organic group containing at least one aromatic ring; $R_2$s may be the same or different, and $R_2$s each represent a divalent organic group containing at least two aromatic rings; $R_3$s may be the same or different, and $R_3$s each represent a monovalent organic group selected from —OH and —$NH_2$; $R_4$s may be the same or different, and $R_4$s each represent a tetravalent organic group containing at least one aromatic ring; V represents a direct bond or a divalent group selected from the group consisting of —O—, —CO—, —O-T-O—, —COO-T-OCO—, —$C(CH_3)_2$—, and —$C(CF_3)_2$—; T represents a divalent organic group; c is an integer of 1 to 15; d is an integer of 0 to 15; c+d is an integer of 1 to 15; the compound represented by general formula (2) may be a block copolymer or a random copolymer); and an epoxy resin component (B) containing at least one epoxy resin.

The thermosetting resin composition preferably further includes a polyimide resin component (C) containing at least one polyimide resin.

According to the above-described composition, satisfactory flowability required for embedding a circuit is obtained, and a cured resin prepared by curing the thermosetting resin composition has a low dielectric constant and low dielectric loss tangent even in the GHz band. That is, it is possible to obtain excellent dielectric characteristics. To be specific, a cured resin prepared by heating the thermosetting resin composition at a temperature of 150° C. to 250° C. for 1 to 5 hours has a dielectric constant of 3.3 or less and a dielectric loss tangent of 0.020 or less in the frequency band of 1 GHz to 10 GHz. Since the cured resin has a dielectric constant of 3.3 or less and a dielectric loss tangent of 0.020 or less in the GHz band, when the inventive thermosetting resin composition is used as a protective material and an interlayer insulating material for circuit boards, the electrical reliability of the circuit board is ensured, and a decrease in electrical signal transmission rate and loss of electrical signals in the circuit on the circuit board can be suppressed.

The inventive thermosetting resin composition has, for example, low coefficient of thermal expansion, satisfactory heat resistance (e.g., a high decomposition temperature), excellent adhesiveness to an adherend, for example, a conductor or a circuit board, and good processability in bonding to a conductor or a circuit board. Therefore, the inventive thermosetting resin composition can be suitably used for making circuit boards such as flexible printed circuit boards and build-up circuit boards.

In this way, the inventive thermosetting resin composition achieves a good balance among the above-described characteristics and thus can be suitably used for, for example, making circuit boards. Furthermore, the inventive thermosetting resin composition can impart various desirable characteristics to circuit boards including the thermosetting resin composition of the present invention.

The mixing ratio by weight of the weight of the polyimide resin component (C) to the total weight of the imide oligomer component (A) and the epoxy resin component (B), i.e., (C)/[(A)+(B)], is preferably in the range of 0.1 to 2.0.

The thermosetting resin composition of the present invention preferably has a minimum melt viscosity of 100 poise to 80,000 poise at a temperature in the range of 60° C. to 200° C.

The molar ratio of the number of moles of active hydrogen groups contained in the imide oligomer component (A) to the number of moles of the epoxy groups contained in the epoxy resin component (B), i.e., (A)/(B), is preferably in the range of 0.4 to 2.0.

The weight-average molecular weight of the imide oligomer component (A) is preferably 15,000 or less.

Satisfactory dielectric characteristics, flowability, heat resistance, adhesiveness, processability, and the like can be imparted to the thermosetting resin composition or a cured resin prepared by curing the thermosetting resin composition while achieving a good balance among these characteristics.

In order to solve the above-described problems, a laminate of the present invention includes at least one resin layer composed of the thermosetting resin composition.

In order to solve the above-described problems, a circuit board of the present invention includes the thermosetting resin composition.

The laminate and the circuit board include the above-described thermosetting resin composition. The thermosetting resin composition can impart various characteristics, such as dielectric characteristics, flowability, heat resistance, adhesiveness, processability, and the like, to resin layers composed of the thermosetting resin composition in the laminate and the circuit board while achieving a good balance among these characteristics. As a result, the laminate and the circuit board can be suitably manufactured. In particular, when a laminate or a circuit board has a circuit or the like, the electrical reliability of the circuit can be ensured, and a decrease in signal transmission rate and loss of signals in the circuit can be suppressed.

Effect of the Invention

The thermosetting resin composition of the present invention essentially contains an imide oligomer and an epoxy resin as described above.

As a result, the thermosetting resin composition having satisfactory flowability required for embedding a circuit, excellent adhesiveness to an adherend such as a circuit board, superb processability and handleability that enable bonding at a low temperature, and outstanding heat resistance with respect to thermal expansion and thermal decomposition can be provided. Furthermore, in the GHz range, a cured resin prepared by curing the thermosetting resin composition has a dielectric constant and a dielectric loss tangent significantly lower than those of a conventional resin composition containing a polyimide resin and an epoxy resin. That is, the thermosetting resin composition having satisfactory dielectric characteristics can be provided.

Accordingly, since the thermosetting resin composition of the present invention enables bonding at lower temperatures compared with a conventional resin composition and has satisfactory processability, handleability, heat resistance, and dielectric characteristics, the thermosetting resin composition achieving a good balance among these characteristics can be provided.

Therefore, the thermosetting resin composition can be advantageously used for making flexible printed circuit boards or build-up circuit boards required to have low dielectric constants and low dielectric loss tangents in the GHz band.

BEST MODE FOR CARRYING OUT THE INVENTION

One of the embodiments of the present invention will be described below. The present invention is not limited to this embodiment.

A thermosetting resin composition according to the present invention is used for, for example, circuit boards such as flexible printed circuit boards and build-up circuit boards and is preferably used as a protective material for protecting the circuit boards and circuit patterns formed on the circuit boards and as an interlayer insulating material for ensuring insulation between layers of multilayer circuit boards.

A thermosetting resin composition of the present invention essentially includes an imide oligomer component (A) containing at least one imide oligomer represented by general formula (1):

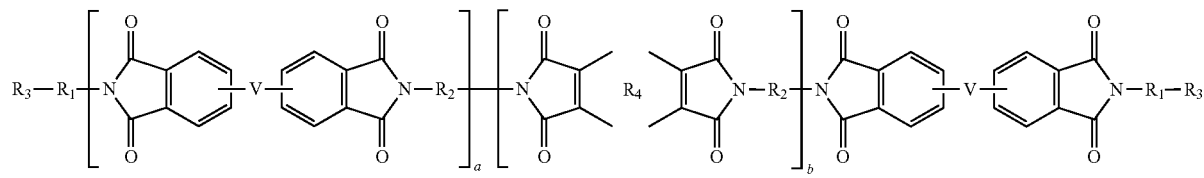

(wherein $R_1$s may be the same or different, and $R_1$s each represent a divalent organic group containing at least one aromatic ring; $R_2$s may be the same or different, and $R_2$s each represent a divalent organic group containing at least two aromatic rings; $R_3$s may be the same or different, and $R_3$s each represent a monovalent organic group selected from —OH and —$NH_2$; $R_4$s may be the same or different, and $R_4$s each represent a tetravalent organic group containing at least one aromatic ring; V represents a direct bond or a divalent group selected from the group consisting of —O—, —CO—, —O-T-O—, —COO-T-OCO—, —C($CH_3$)$_2$—, and —C($CF_3$)$_2$—; T represents a divalent organic group; a and b independently represent an integer of 0 to 15; a+b represents an integer of 0 to 15; and the compound represented by general formula (1) may be a block copolymer or a random copolymer) or general formula (2):

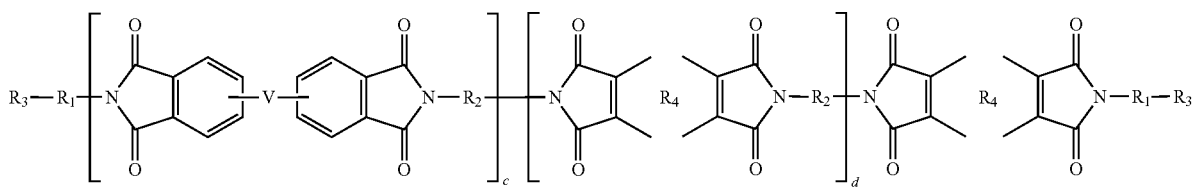

(wherein $R_1$s may be the same or different, and $R_1$s each represent a divalent organic group containing at least one aromatic ring; $R_2$s may be the same or different, and $R_2$s each represent a divalent organic group containing at least two aromatic rings; $R_3$s may be the same or different, and $R_3$s each represent a monovalent organic group selected from —OH and —$NH_2$; $R_4$s may be the same or different, and $R_4$s each represent a tetravalent organic group containing at least one aromatic ring; V represents a direct bond or a divalent group selected from the group consisting of —O—, —CO—, —O-T-O—, —COO-T-OCO—, —C($CH_3$)$_2$—, and —C($CF_3$)$_2$—; T represents a divalent organic group; c is an integer of 1 to 15; d is an integer of 0 to 15; c+d is an integer of 1 to 15; the compound represented by general formula (2) may be a block copolymer or a random copolymer); and an epoxy resin component (B) containing at least one epoxy resin.

With respect to mixing ratio of the components in the thermosetting resin composition, in the molar ratio of the number of moles of active hydrogen groups contained in the imide oligomer component (A) to the number of moles of the epoxy groups of the epoxy resin contained in the epoxy resin component (B), i.e., (A)/(B), the lower limit is preferably 0.4 or more and more preferably 0.7 or more. The upper limit of the molar ratio, i.e., (A)/(B), is preferably 2.0 or less and more preferably 1.1 or less.

A molar ratio, i.e., (A)/(B), of less than 0.4 or more than 2.0 may degrade the dielectric characteristics of a cured resin prepared by curing the thermosetting resin composition. Furthermore, the glass transition temperature, coefficient of thermal expansion, and elastic modulus of the thermosetting resin composition at high temperature may be reduced, and the heat resistance of the thermosetting resin composition may be impaired.

The number of moles of the epoxy groups can be calculated from the epoxy value. The number of active hydrogen in the imide oligomer can be calculated from the molecular weight of the imide oligomer and the number of amino groups or hydroxyl groups existing in the imide oligomer.

Here, the term "active hydrogen" in the present invention refers to a hydrogen atom directly bonded to the nitrogen atom in an amino group or a hydrogen atom directly bonded to the oxygen atom in a hydroxyl group. In general, there are two active hydrogen atoms per amino group, and there is one active hydrogen atom per hydroxyl group.

In order to improve heat resistance and impart flexibility to a cured product to be obtained, preferably, the thermosetting resin composition of the present invention further contains a polyimide resin as a component (C). In the mixing ratio by weight of the content of the polyimide resin component (C) to the total content of the imide oligomer component (A) and the epoxy resin component (B), i.e., (C)/[(A)+(B)], the lower limit is preferably 0.1 or more and more preferably 0.5 or more. The upper limit of the mixing ratio by weight, i.e., (C)/[(A)+(B)], is preferably 2.0 or less and more preferably 1.5 or less.

By incorporating the polyimide resin (C), dielectric characteristics in the GHz band and heat resistance with respect to, for example, thermal decomposition and thermal expansion in the region below the glass transition temperature can be imparted to a cured resin. By incorporating a thermosetting resin component containing the imide oligomer component (A) and the epoxy resin component (B), resin flowability before curing, which is important in processing, such as bonding to a conductor and a circuit board and embedding a circuit during lamination, and heat resistance indicated by, for example, the high temperature modulus and the coefficient of linear thermal expansion of a cured resin sheet can be imparted. When the mixing ratio is within the range described above, a resin composition achieving a good balance among these characteristics can be obtained.

In the inventive thermosetting resin composition having the mixing ratio by weight described above, a cured resin prepared by curing the thermosetting resin composition exhibits satisfactory dielectric characteristics in the GHz band. That is, a cured resin prepared by heating the thermosetting resin composition in the temperature range of 150° C. to 250° C. for 1 to 5 hours has a dielectric constant of 3.3 or less and a dielectric loss tangent of 0.020 or less in the frequency range of 1 GHz to 10 GHz. When the thermosetting resin composition of the present invention is used for a protective material and interlayer insulating material for circuit boards as long as the dielectric constant and the dielectric loss tangent are within the range described above, the electrical insulation of the circuit board is ensured, and a decrease in electrical signal transmission rate and loss of electrical signals in the circuit on the circuit board can be suppressed. Therefore, a highly reliable circuit board can be provided.

As described above, by setting the compounding ratio among the imide oligomer (A), the epoxy resin (B), and the polyimide resin (C) in the thermosetting resin composition within a specific range, it is possible to obtain a thermosetting resin composition having various characteristics, such as flowability required for embedding a circuit, adhesiveness to a adherend such as a circuit board or a conductor, processability and handleability that enable bonding at a low temperature, heat resistance with respect to thermal expansion and thermal decomposition, moisture resistance evaluated by a pressure cooker test (PCT) using a pressure cooker, resistance to soldering heat, insulation, dielectric characteristics of a cured resin obtained by curing the thermosetting resin composition, while achieving a good balance among these characteristics. The imide oligomer component (A), the epoxy resin component (B), the polyimide resin component (C), and any other component contained in the thermosetting resin composition will be described in detail below.

Imide Oligomer Component (A)

In the thermosetting resin composition of the present invention, by including an imide oligomer component (A) containing at least one imide oligomer represented by general formula (1):

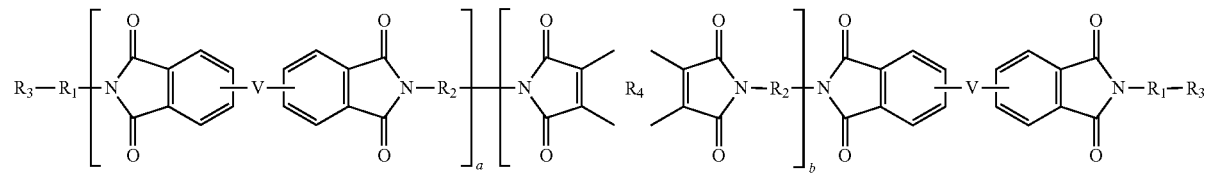

(1)

(wherein $R_1$s may be the same or different, and $R_1$s each represent a divalent organic group containing at least one aromatic ring; $R_2$s may be the same or different, and $R_2$s each represent a divalent organic group containing at least two aromatic rings; $R_3$s may be the same or different, and $R_3$s each represent a monovalent organic group selected from —OH and —$NH_2$; $R_4$s may be the same or different, and $R_4$s each represent a tetravalent organic group containing at least one aromatic ring; V represents a direct bond or a divalent group selected from the group consisting of —O—, —CO—, —O-T-O—, —COO-T-OCO—, —C($CH_3$)$_2$—, and —C($CF_3$)$_2$—; T represents a divalent organic group; a and b independently represent an integer of 0 to 15; a+b represents an integer of 0 to 15; and the compound represented by general formula (1) may be a block copolymer or a random copolymer) or general formula (2):

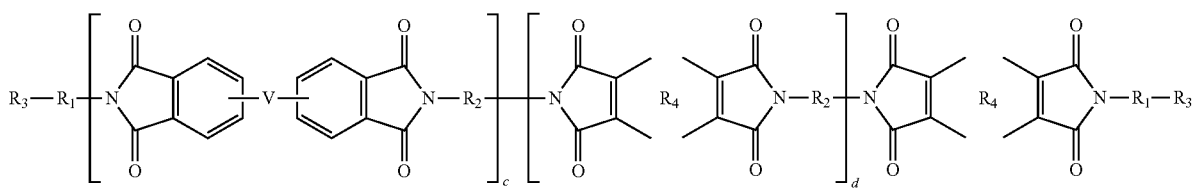

(2)

(wherein $R_1$s may be the same or different, and $R_1$s each represent a divalent organic group containing at least one aromatic ring; $R_2$s may be the same or different, and $R_2$s each represent a divalent organic group containing at least two aromatic rings; $R_3$s may be the same or different, and $R_3$s each represent a monovalent organic group selected from —OH and —$NH_2$; $R_4$s may be the same or different, and $R_4$s each represent a tetravalent organic group containing at least one aromatic ring; V represents a direct bond or a divalent group selected from the group consisting of —O—, —CO—, —O-T-O—, —COO-T-OCO—, —C($CH_3$)$_2$—, and —C($CF_3$)$_2$—; T represents a divalent organic group; c is an integer of 1 to 15; d is an integer of 0 to 15; c+d is an integer of 1 to 15; the compound represented by general formula (2) may be a block copolymer or a random copolymer), resin flowability is imparted to the thermosetting resin composition, and heat resistance is imparted to a cured resin obtained by curing the thermosetting resin composition. Furthermore, by including an imide oligomer component (A), the epoxy resin component (B) described below can be efficiently cured when curing the thermosetting resin composition.

The imide oligomer component (A) has imide groups and can thus impart flexibility, satisfactory mechanical characteristics, chemical resistance, and excellent dielectric characteristics (low dielectric constant and low dielectric loss tangent) in the GHz range to a cured resin obtained by curing the thermosetting resin composition.

The weight-average molecular weight of the imide oligomer component is not particularly limited as long as the number of the constitutional repeating unit is in the range of 1 to 15. The upper limit is preferably 15,000 or less and more preferably 10,000 or less from the standpoint of satisfactory solubility in a solvent and excellent flowability.

The imide oligomer can be produced by a known process, for example, by chemically or thermally imidizing an amic acid oligomer, which is a precursor of the imide oligomer.

To explain a process for producing the imide oligomer, a method for preparing an amic acid oligomer and a method in which the amic acid oligomer is imidized by dehydration to yield a polyimide resin will be described in detail below.

(Method for Producing Amic Acid Oligomer)

The amic acid oligomer can be produced by allowing an acid dianhydride component containing at least one acid dianhydride to react with an amine component containing at least one diamine and/or a monoamine having a hydroxyl group in an organic solvent, the number of moles of the amine fed exceeding that of the acid anhydride.

For example, an imide oligomer principally containing an imide oligomer in which the repeating unit n is 1 and in which a functional group at a terminus is an amino group can be produced by allowing 1 mol of an acid dianhydride to react with substantially 2 mol of a diamine.

An example of a typical method of the above-described reaction is a method in which the amine component is dissolved in an organic solvent, and then the acid dianhydride component is added thereto to prepare a solution in which an amic acid oligomer is dissolved (hereinafter referred to as a "polyamic acid solution"). The term "dissolution" includes a state in which a solute is completely dissolved in a solvent; and a case in which a solute is uniformly dispersed or diffused in a solvent to produce substantially the same state as that in which the solute is dissolved.

The order of addition of the amine component and the acid dianhydride component is not limited to the above. The addition method can be appropriately changed, corrected, or modified by those skilled in the art. That is, for example, a method in which the acid dianhydride component is dissolved or diffused in the organic solvent, and then the amine component is added thereto to form an amide oligomer solution may be employed as the addition method described above.

Temperature conditions in the reaction between the acid dianhydride and the amine described above (synthetic reaction of amic acid oligomer) is not particularly limited as long as the acid dianhydride and the amine can be polymerized, but the reaction temperature is preferably 80° C. or less and more preferably in the range of 0° C. to 50° C. The reaction time is not particularly limited as long as the polymerization reaction between the acid dianhydride and the amine is completed. It is possible to appropriately set the reaction time in the range of 30 minutes to 50 hours.

The organic solvent used in the synthetic reaction of the amic acid oligomer is not particularly limited as long as a polar organic solvent is used. In the production process, in order to, for example, dissolve the amic acid oligomer and a raw material for the amic acid oligomer and to facilitate the drying of the imide oligomer in preparing the imide oligomer, it is advantageous to select an organic solvent having a boiling point as low as possible.

Specific examples of the organic solvent used for the synthetic reaction of the amic acid oligomer include sulfoxide solvents such as dimethyl sulfoxide and diethyl sulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenol solvents such as phenol, o-cresol, m-cresol, p-cresol, xylenol, halogenated phenol, and catechol; hexamethylphosphoramide; and γ-butyrolactone. Furthermore, according to need, the above-described organic solvent may be used in combination with aromatic hydrocarbons such as xylene and toluene.

(Acid Dianhydride Used for Manufacture of Amic Acid Oligomer)

The acid dianhydride contained in the acid dianhydride component used for synthesizing the amic acid oligomer preferably has a structure represented by general formula (3):

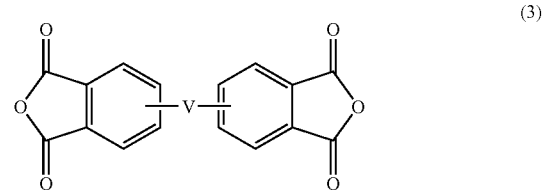

(wherein V represents a direct bond or a divalent group selected from the group consisting of —O—, —CO—, —O-T-O—, COO-T-OCO—, —C(CH$_3$)$_2$—, and —C(CF$_3$)$_2$—; and T represents a divalent organic group), in view of solubility in various organic solvents, heat resistance, and compatibility with the epoxy resin component (B) and the polyimide resin (C) described below.

Among the acid dianhydrides represented by general formula (3), in order to prepare a cured resin having a low dielectric constant and a low dielectric loss tangent in the GHz range and having satisfactory heat resistance, V in general formula (3) is preferably —O-T-O— or —COO-T-OCO—.

T preferably represents a divalent group selected from the group represented by the following general formula:

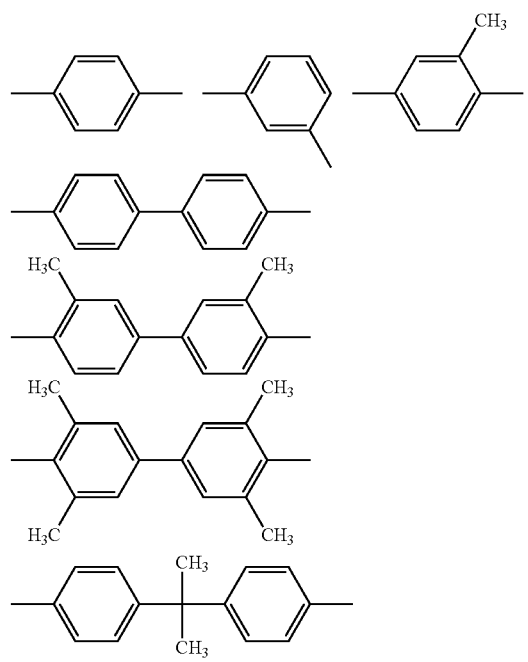

or represents a divalent group having a structure represented by general formula (4):

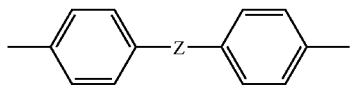
(4)

(wherein Z represents a divalent group selected from the group consisting of —(CH$_2$)$_q$—, —C(=O)—, —SO$_2$—, —O—, and —S—; and q is an integer of 1 to 5).

Among these, from the standpoint of, for example, capability to produce a polyimide resin having various characteristics, such as solubility in various organic solvents, heat resistance, compatibility with the epoxy resin component (B) and the polyimide resin (C), and dielectric characteristics, while achieving a good balance among these characteristics; and ease of availability, 4,4'-(4,4'-isopropylidenediphenoxy)bisphthalic dianhydride represented by the following general formula:

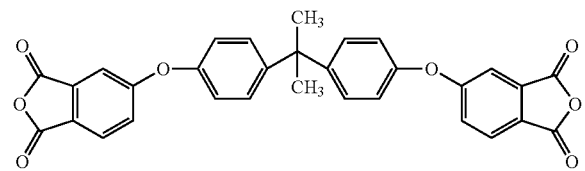

is particularly preferably used as the acid dianhydride.

For the synthesis of the polyimide resin, an acid dianhydride component containing at least one acid dianhydride selected from the above-described acid dianhydrides having a structure represented by general formula (3) described above should be used. That is, among the acid anhydrides described above, the acid dianhydride component may contain one acid anhydride alone or at least two acid anhydrides at any desired ratio. In addition, the acid dianhydride component may contain an acid dianhydride having a structure other than that represented by general formula (3) described above (hereinafter referred to as "other acid dianhydrides").

The content of the acid dianhydride having a structure represented by general formula (3) in the acid dianhydride component is preferably 50 mol % or more of the total content of the acid dianhydrides in the acid dianhydride component. When the content is 50 mol % or more, an imide oligomer having satisfactory solubility in various organic solvents, compatibility with the epoxy resin component (B), and dielectric characteristics can be produced.

Among the acid dianhydrides contained in the acid dianhydride component, examples of the other acid dianhydrides having a structure other than that represented by general formula (3) described above include anhydrides of pyromellitic acid, 1,2,3,4-benzenetetracarboxylic acid, 1,2,3,4-cyclobutanetetracarboxylic acid, 1,2,4,5-cyclopentanetetracarboxylic acid, 1,2,4,5-cyclohexanetetracarboxylic acid, 3,3',4,4'-bicyclohexyltetracarboxylic acid, 2,3,5-tricarboxycyclopentylacetic acid, 3,4-dicarboxy-1,2,3,4-tetrahydronaphthalene-1-succinic acid, bis(3,4-dicarboxyphenyl)methane, bis(2,3-dicarboxyphenyl)methane, 1,1-bis(2,3-dicarboxyphenyl)ethane, 3,3',4,4'-diphenylsulfonetetracarboxylic acid, 2,3,3'4'-diphenylsulfonetetracarboxylic acid, 2,3,6,7-naphthalenetetracarboxylic acid, 1,4,5,8-naphthalenetetracarboxylic acid, 1,2,5,6-naphthalenetetracarboxylic acid, 3,4,9,10-tetracarboxyperylene acid, 2,2-bis[4-(3,4-dicarboxyphenoxy)phenyl]propanoic acid, 2,2-bis[4-(3,4-dicarboxyphenoxy)phenyl]hexafluoropropanoic acid, 3,3',4,4'-dimethyldiphenylsilanetetracarboxylic acid, 1,2,3,4-furantetracarboxylic acid, 4,4'-bis(3,4-dicarboxyphenoxy)diphenylpropanoic acid, 4,4'-hexafluoroisopropylidenediphthalic acid, and p-phenylenediphthalic acid, and their lower alkyl esters. Of course, the other acid dianhydrides are not limited to these.

These compounds may be used alone or in combination of two or more. However, as described above, it is extremely preferred to use at least one acid dianhydride represented by general formula (3).

(Amine Component Used for Manufacture of Amic Acid Oligomer)

Amine contained in the amine component used for synthesizing the amic acid oligomer is broadly divided into an amine component used at a terminus of the imide oligomer (for the convenience, referred to as a "terminal amine component") and an amine component used at a position other than the terminus of the imide oligomer (for the convenience, referred to as a "diamine component").

It is preferable that the terminal amine component and the diamine component are capable of forming an imide oligomer having satisfactory solubility in various organic solvents, high heat resistance, and excellent heat resistance to soldering, outstanding PCT (pressure cooker test) resistance, low water absorption, and the like. In particular, aromatic amines are preferred. These components will be described separately in the following terminal amine component section and diamine component section.

(Terminal Amine Component)

The terminal amine component preferably has a structure represented by general formula (5):

(5)

(wherein R$_1$ represents a divalent organic group containing at least one aromatic ring; and R$_3$ represents a monovalent organic group selected from —OH and —NH$_2$).

Examples of the amine having the structure represented by general formula (5) described above include phenylenediamines such as 1,4-diaminobenzene, 1,2-diaminobenzene, and 1,3-diaminobenzene; diaminodiphenyl ethers such as 4,4'-diaminodiphenyl ether and 1,3'-diaminodiphenyl ether; bis[(aminophenoxy)phenyl]alkanes such as bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, and 2,2-bis[4-(3-aminophenoxy)phenyl]butane; bis[(aminophenoxy)phenyl]fluoroalkanes such as 2,2-bis[3-(3-aminophenoxy)phenyl]-1,1,1,3,3,3-hexafluoropropane and 2,2-bis[4-(4-aminophenoxy)phenyl]-1,1,1,3,3,3-hexafluoropropane; bis(aminophenoxy)benzene compounds such as 1,3-bis(3-aminophenoxy)benzene, 1,4-bis(3-aminophenoxy)benzene, 1,4'-bis(4-aminophenoxy)benzene, and 4,4'-bis(4-aminophenoxy)biphenyl; bis(aminophenoxy)ketone compounds such as bis[4-(3-aminophenoxy)phenyl]ketone and bis[4-(4-aminophenoxy)phenyl]ketone; bis[(aminophenoxy)phenyl] sulfide compounds such as bis[4-(3-aminophenoxy)phenyl] sulfide and bis[4-(4-aminophenoxy)phenyl]sulfide; bis[(aminophenoxy)phenyl]sulfone compounds such as bis[4-(3-aminophenoxy)phenyl]sulfone and bis[4-(4-aminophenoxy)phenyl]sulfone; bis[(aminophenoxy)phenyl]

ether compounds such as bis[4-(3-aminophenoxy)phenyl] ether and bis[4-(4-aminophenoxy)phenyl]ether; bis[(aminophenoxy)benzoyl]benzene compounds such as 1,4-bis[4-(3-aminophenoxy)benzoyl]benzene and 1,3-bis[4-(3-aminophenoxy)benzoyl]benzene; bis[(aminophenoxy)benzoyl]diphenyl ether compounds such as 4,4'-bis[3-(4-aminophenoxy)benzoyl]diphenyl ether and 4,4'-bis[3-(3-aminophenoxy)benzoyl]diphenyl ether; benzophenone compounds such as 4,4'-bis[4-(4-amino-α,α-dimethylbenzyl)phenoxy]benzophenone; (phenoxy)phenyl sulfone compounds such as 4,4'-diaminodiphenyl sulfone, 4,4'-bis[4-(4-amino-α,α-dimethylbenzyl)phenoxy]diphenyl sulfone, and bis[4-{4-(4-aminophenoxy)phenoxy}phenyl]sulfone; and bis[(aminophenoxy)dimethylbenzene]benzene compounds such as 1,4-bis[4-(4-aminophenoxy)-α,α-dimethylbenzyl]benzene and 1,3-bis[4-(4-aminophenoxy)-α,α-dimethylbenzyl]benzene.

Alternatively, the amine contained in the amine component may have a hydroxyl group. The amine having a hydroxyl group is not particularly limited as long as the amine has a hydroxyl group. Examples thereof include aminophenols such as 4-aminophenol, 3-aminophenol, and 2-aminophenol; aminophenoxyphenols such as 4-(4-aminophenoxy)phenol and 4-(3-aminophenoxy)phenol; diaminophenol compounds such as 2,4-diaminophenol; diaminobiphenyl compounds such as 3,3'-dihydroxy-4,4'-diaminobiphenyl; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; hydroxydiphenylalkanes such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane, and 4,4'-diamino-2,2',5,5'-tetrahydroxydiphenylmethane; hydroxydiphenyl ether compounds such as 3,3'-diamino-4,4'-dihydroxydiphenyl ether, 4,4'-diamino-3,3'-dihydroxydiphenyl ether, 4,4'-diamino-2,2'-dihydroxydiphenyl ether, and 4,4'-diamino-2,2',5,5'-tetrahydroxydiphenyl ether; diphenyl sulfone compounds such as 3,3'-diamino-4,4'-dihydroxydiphenyl sulfone, 4,4'-diamino-3,3'-dihydroxydiphenyl sulfone, 4,4'-diamino-2,2'-dihydroxydiphenyl sulfone, and 4,4'-diamino-2,2',5,5'-tetrahydroxydiphenyl sulfone; bis[(hydroxyphenyl)phenyl]alkanes such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; and bis[(hydroxyphenoxy)phenyl]sulfone compounds such as 2,2-bis[4-(4-amino-3-hydroxyphenoxy)phenyl]sulfone.

In particular, from the standpoint of satisfactory solubility in a solvent, high reactivity to an epoxy resin, and ease of availability, $R_1$ in general formula (5) preferably represents a divalent organic group selected from the group represented by the following:

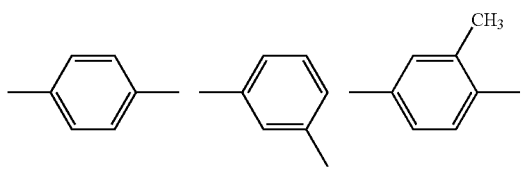

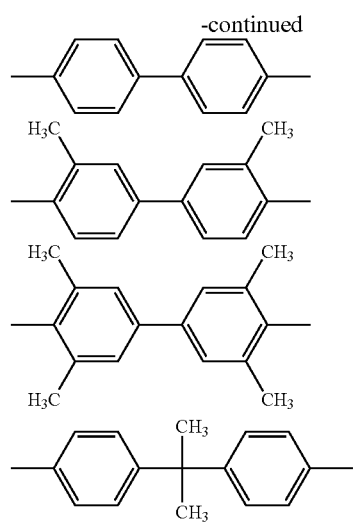

or general formula (6):

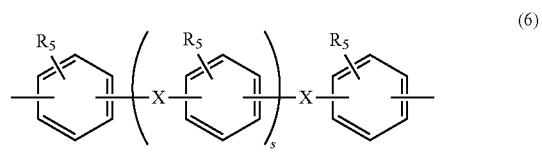

(6)

(wherein Xs independently represent a divalent group selected from the group consisting of —C(=O)—, —SO$_2$—, —O—, —S—, —(CH$_2$)l-, —NHCO—, —C(CH$_3$)$_2$—, —C(CF$_3$)$_2$—, and —C(=O)O—, or a direct bond; $R_5$s independently represent —OH, —NH$_2$, hydrogen, halogen, or an alkyl group having 1 to 4 carbon atoms; and l and s independently are an integer of 0 to 5).

(Diamine Component)
A diamine in which $R_3$ in general formula (5) represents NH$_2$ may be used as the diamine component. From the standpoint of solubility in a solvent for the imide oligomer, the diamine component preferably contains a diamine represented by general formula (7):

(wherein $R_2$ represents a divalent organic group containing at least one aromatic ring). In particular, from the standpoint of satisfactory solubility in a solvent, high reactivity to an epoxy resin, and ease of availability, $R_2$ in general formula (7) described above preferably represents a divalent organic group represented by general formula (6):

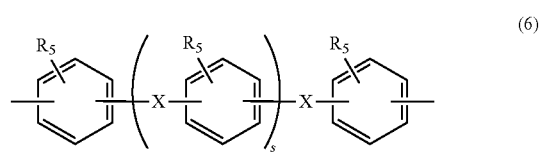

(6)

(wherein Xs independently represent a divalent group selected from the group consisting of —C(=O)—, —SO$_2$—, —O—, —S—, —(CH$_2$)$_1$—, —NHCO—, —C(CH$_3$)$_2$—, —C(CF$_3$)$_2$—, and —C(=O)O—, or a direct bond; $R_5$s independently represent —OH, —NH$_2$, hydrogen, halogen, or an alkyl group having 1 to 4 carbon atoms; and 1 and s independently are an integer of 0 to 5).

(Imidization of Amic Acid Oligomer)

To obtain an imide oligomer from an amic acid oligomer solution containing the amic acid oligomer, a method for imidizing the amic acid oligomer will be described. The imidization is performed by, for example, thermal process for dehydrating the polyamic acid in the polyamic acid solution. The term "thermal process" means a process for dehydrating the amic acid oligomer solution by heating. The process will be described below.

An example of the dehydration by the thermal process is a process for promoting the imidization reaction by heating the amic acid oligomer solution while evaporating the solvent. By employing this thermal process, it is possible to obtain a solid polyimide resin. The heating conditions are not particularly limited. The heating is preferably performed at a temperature of 300° C. or less for about 5 to 20 minutes.

In the above-described thermal process, the process for evaporating the solvent is described. Alternatively, a process in which a solvent is not evaporated may be employed. To be specific, the process is as follows: an imide oligomer solution obtained by the thermal process is added to a poor solvent to precipitate the imide oligomer, and then unreacted monomers (acid dianhydride and amine) are removed, followed by purification and drying to obtain a solid imide oligomer. The poor solvent is not particularly limited as long as the poor solvent is satisfactorily mixed with the solvent used for the imide oligomer solution but is difficult to dissolve the imide oligomer. Examples thereof include acetone, methanol, ethanol, isopropanol, benzene, Methyl Cellosolve (registered trademark), and methyl ethyl ketone.

In a process for imidizing the amic acid oligomer by heating under reduced pressure, the heating temperature should be 80° C. to 400° C. To achieve efficient imidization and dehydration, the heating temperature is 100° C. or more and more preferably 120° C. or more. The maximum temperature in the heating is preferably up to the thermal decomposition temperature of the imide oligomer and, in general, is set in the range of about 250° C. to 350° C. at which imidizing is complete. With respect to the pressure conditions, a low pressure is preferable. To be specific, the pressure is preferably in the range of 0.001 atm to 0.9 atm, more preferably 0.001 atm to 0.8 atm, and most preferably 0.001 atm to 0.7 atm.

According to the above-described process for imidizing the amic acid oligomer by heating under reduced pressure, water formed during the imidization can be positively removed from the system, thereby suppressing the hydrolysis of the polyamic acid. As a result, it is possible to obtain an imide oligomer having a target molecular weight. Furthermore, by employing this process, it is possible to cyclizing a compound having an open-circular form at one end or a compound having an open-circular form at both ends, these compounds being impurities contained in the acid dianhydride serving as a raw material for the amic acid oligomer. Therefore, the control of the molecular weight of the imide oligomer can be further improved.

Epoxy Resin Component (B)

The epoxy resin contained in the thermosetting resin composition of the present invention will be described below. In the thermosetting resin composition of the present invention, by incorporating the epoxy resin component (B) containing at least one epoxy resin, resin flowability is imparted to the thermosetting resin composition, and heat resistance and insulation are imparted to a cured resin obtained by curing the thermosetting resin composition. Furthermore, adhesiveness to a conductor, such as a metal foil, and a circuit board can be imparted.

Examples of the epoxy resin include, but are not particularly limited to, epoxy resins such as bisphenol epoxy resins, bisphenol A novolac epoxy resins, biphenyl epoxy resins, phenol novolac epoxy resins, alkylphenol novolac epoxy resins, polyglycol epoxy resins, alicyclic epoxy resins, cresol novolac epoxy resins, glycidyl amine epoxy resins, naphthalene epoxy resins, urethane-modified epoxy resins, rubber-modified epoxy resins, and epoxy-modified polysiloxane; resins obtained by halogenating these epoxy resins; and crystalline epoxy resins having melting points.

Among the epoxy resins described above, epoxy resins having at least one aromatic ring and/or aliphatic ring in their molecular chains, biphenyl epoxy resins having the biphenyl skeleton, naphthalene epoxy resins having the naphthalene skeleton, and crystalline epoxy resins having melting points are preferable. These epoxy resins are readily available and highly compatible with the imide oligomer component (A), the polyimide resin (C) described below, and additional components (D). Furthermore, these epoxy resins can impart satisfactory resin flowability to the thermosetting resin composition and can impart high heat resistance and excellent insulation to the cured resin. Among these epoxy resins described above, in particular, from the standpoint of a good balance among various characteristics such as dielectric characteristics, heat resistance, and circuit embedding properties, an epoxy resin component containing an epoxy resin selected from the group represented by the following:

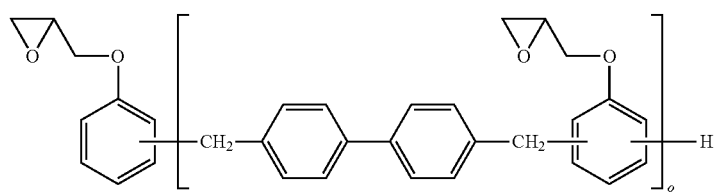

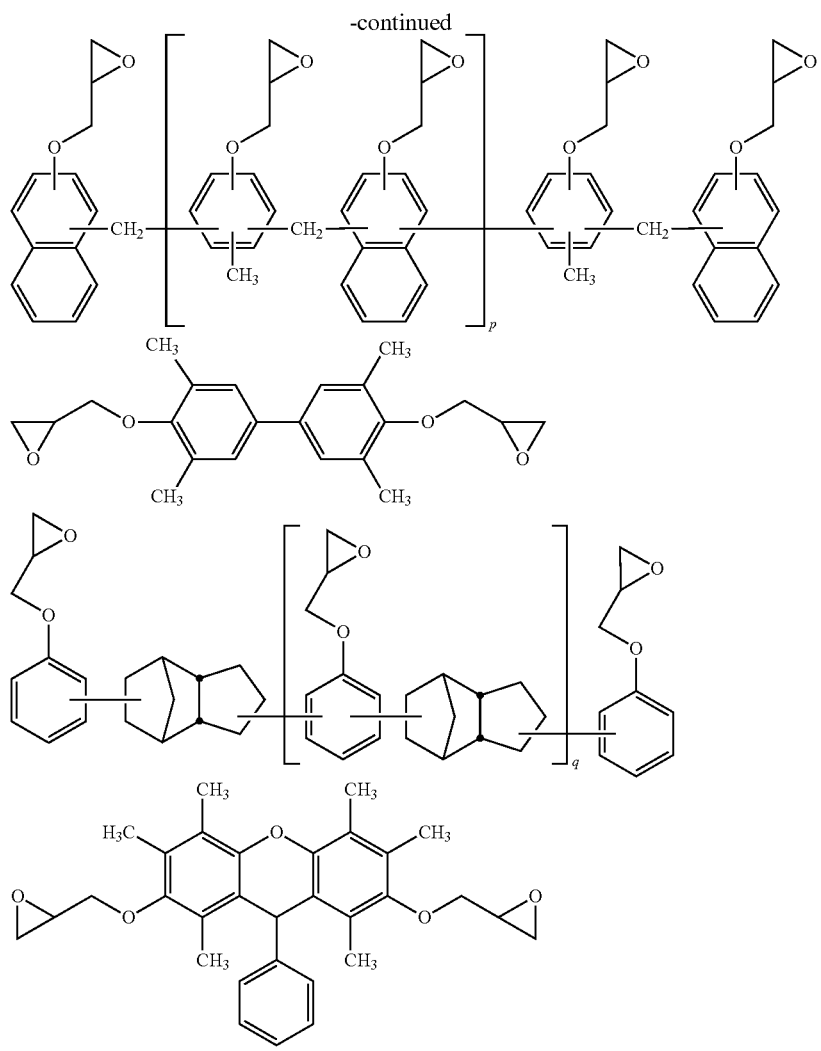

(wherein o and p each represent an integer of 1 to 5) is preferred. In particular, an epoxy resin component containing a crystalline epoxy resin selected from the following:

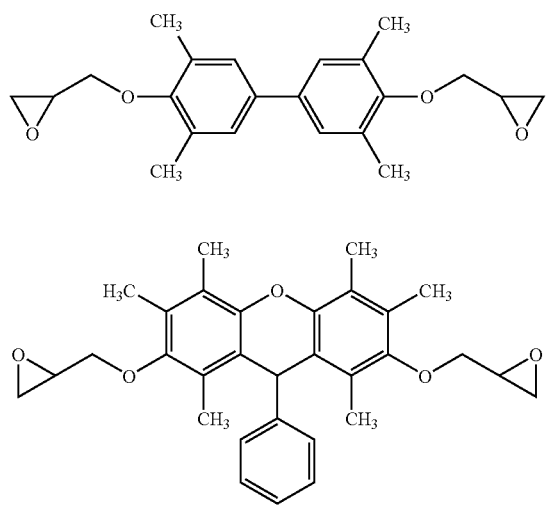

is more preferable in view that specifically low melt viscosity is achieved and thus circuit embedding properties can be significantly improved.

In the case of the use of the crystalline epoxy resin, the lower limit of the melting point is preferably 60° C. or more and more preferably 80° C. or more. The upper limit of the melting point is 300° C. or less and more preferably 250° C. or less. At a melting point less than 60° C., when the thermosetting resin composition is formed into a sheet, in some cases, phase separation occurs during the formation, thus depositing the epoxy resin on the surface of the sheet or resulting in a sticky sheet. At the melting point exceeding 300° C., in some cases, a temperature required for bonding the thermosetting resin composition with a circuit board and the like is increased.

To achieve high electrical insulation with high-reliability, a high-purity epoxy resin is preferably used as the epoxy resin contained in the thermosetting resin composition. That is, the content of halogen and alkali metal contained in the epoxy resin is preferably 25 ppm or less and more preferably 15 ppm or less, when the halogen and alkali metal are extracted at 120° C. and 2 atm. If the content of halogen and alkali metal exceeds 25 ppm, the reliability of electric insulation may be impaired in the cured resin obtained by curing the thermosetting resin composition.

The lower limit of the epoxy value (also referred to as "epoxy equivalent") of the epoxy resin described above is preferably 150 or more, more preferably 170 or more, and most preferably 190 or more. The upper limit of the epoxy value of the epoxy resin is preferably 700 or less, more preferably 500 or less, and most preferably 300 or less.

If the epoxy value of the epoxy resin described above is less than 150, dielectric characteristics may be impaired because of an increase in the number of polar groups in the cured resin obtained by curing the thermosetting resin composition. That is, the dielectric constant and dielectric loss tangent of the cured resin may be increased. On the other hand, if the epoxy value exceeds 700, heat resistance may be impaired because of a reduction in crosslinking density in the cured resin.

(Polyimide Resin Component (C))

In the thermosetting resin composition of the present invention, by further incorporating a polyimide resin component (C) containing at least one polyimide resin in addition to the component (A) and the component (B), heat resistance is imparted to the thermosetting resin composition. Furthermore, flexibility, good mechanical characteristics, chemical resistance are imparted to a cured resin obtained by curing the thermosetting resin composition. In addition, excellent dielectric characteristics (low dielectric constant and low dielectric loss tangent) in the GHz band can be imparted.

The polyimide resin is not particularly limited but is preferably a soluble polyimide resin that is soluble in an organic solvent. The term "soluble polyimide resin" means a polyimide resin having a solubility of 1 percent by weight or more in an organic solvent at 15° C. to 100° C.

The above-described organic solvent may be at least one solvent selected from, for example, ether solvents such as dioxane, dioxolane, and tetrahydrofuran; acetamide solvents such as N,N-dimethylformamide and N,N-diethylacetamide; formamide solvents such as N,N-diethylformamide; N,N-dimethylacetamide; and pyrrolidone solvents such as N-methyl-2-pyrrolidone and N-vinyl-2-pyrrolidone.

In the case of the use of the soluble polyimide resin, high-temperature, long-time treatment is not required in thermally curing the thermosetting resin composition of the present invention. Therefore, use of the soluble polyimide resin as the polyimide resin is preferable from the standpoint of processability.

The polyimide resin can be produced by a known process, for example, by chemically or thermally imidizing a polyamic acid that is a precursor of the polyimide resin.

To explain a method for producing the polyimide resin described above, a method for producing a polyamic acid and a method in which the polyamic acid is imidized by dehydration to form a polyimide resin will be described below.

(Method for Producing Polyamic Acid)

The polyamic acid can be produced by allowing an acid dianhydride component containing at least one acid dianhydride to react with a diamine component containing at least one diamine in an organic solvent so that the amount of acid dianhydride is substantially equimolar to the amount of diamine. Alternatively, when at least two acid dianhydride components and at least two diamine components are used, the molar ratio of the total amount of the plurality of diamine components and the molar ratio of the total amount of the plurality of acid dianhydride components are adjusted so that the total amount of the plurality of diamine components is substantially equimolar to the total amount of the plurality of acid dianhydride components. Therefore, a polyamic acid copolymer can be desirably obtained.

An example of a typical method of the above-described reaction is a method in which the diamine component is dissolved in an organic solvent, and then the acid dianhydride component is added thereto to prepare a solution in which a polyamic acid is dissolved (hereinafter referred to as a "polyamic acid solution"). The term "dissolution" includes a state in which a solute is completely dissolved in a solvent; and a case in which a solute is uniformly dispersed or diffused in a solvent to produce substantially the same state as that in which the solute is dissolved.

The order of addition of the diamine component and the acid dianhydride is not limited to the above. The addition process can be appropriately changed, corrected, or modified by those skilled in the art. That is, a process for producing a polyamic acid solution by dissolving or diffusing the acid dianhydride component in the organic solvent and adding the diamine component, may be employed as the addition process described above. Alternatively, a process for producing a polyamic acid solution by adding an appropriate amount of the diamine component to an organic solvent, adding the acid dianhydride component containing an excessive amount of the acid dianhydride based on the amount of the diamine in the diamine component, and adding the diamine component containing an excessive amount of the diamine based on the amount of the acid dianhydride, may also be employed.

Temperature condition in the reaction between the acid dianhydride and the diamine described above (synthetic reaction of polyamic acid) is not particularly limited as long as the acid dianhydride and the diamine can be polymerized, and specifically the reaction temperature is preferably 80° C. or less and more preferably in the range of 0° C. to 50° C. The reaction time is not particularly limited as long as the polymerization reaction between the acid dianhydride and the diamine is completed. It is possible to appropriately set the reaction time in the range of 30 minutes to 50 hours.

Furthermore, the organic solvent used in the synthetic reaction of the polyamic acid is not limited as long as the organic solvent is a polar organic solvent. However, in the production process, in order to, for example, facilitate stirring by suppressing an increase in viscosity in polymerizing the polyamic acid and to facilitate the drying of a polyimide resin in producing the polyimide resin, it is advantageous to select a good solvent for the polyamic acid and an organic solvent having a boiling point as low as possible.

To be specific, examples of the organic solvent used in the synthetic reaction of the polyamic acid include sulfoxide solvents such as dimethyl sulfoxide and diethyl sulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenol solvents such as phenol, o-cresol, m-cresol, p-cresol, xylenol, halogenated phenol, and catechol; hexamethylphosphoramide; and γ-butyrolactone. Furthermore, according to need, the above-described organic solvent may be used in combination with aromatic hydrocarbons such as xylene and toluene.

(Acid Dianhydride Used for Manufacture of Polyamic Acid)

The acid dianhydride contained in the acid dianhydride component used for synthesizing the polyamic acid is not particularly limited as long as a polyimide resin having solubility in various organic solvents, heat resistance, and compatibility with the imide oligomer component (A) and epoxy resin component (B) described above. An aromatic tetracarboxylic dianhydride is preferable. To be specific, the acid dianhydride preferably has a structure represented by general formula (3):

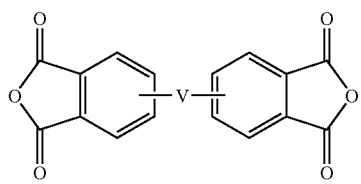

(3)

(wherein V represents a divalent group selected from the group consisting of —O—, —CO—, —O-T-O—, and —COO-T-OCO—; and T represents a divalent organic group).

Among the acid dianhydrides represented by general formula (3), in particular, in order to achieve a cured resin having a low dielectric constant and a low dielectric loss tangent in the GHz band and having satisfactory heat resistance, V in general formula (3) is preferably —O-T-O— or —COO-T-OCO—.

T preferably represents a divalent group selected from the group represented by the following general formula:

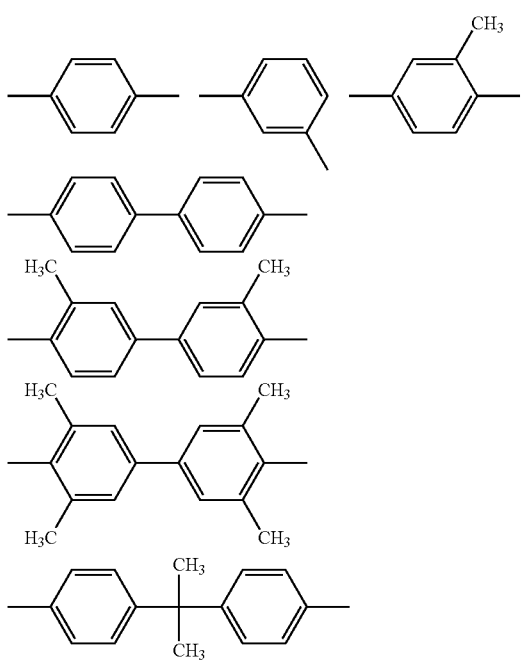

or represents a divalent group having a structure represented by general formula (4):

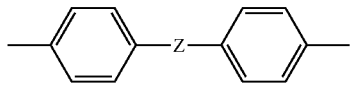

(4)

(wherein Z represents a divalent group selected from the group consisting of —$(CH_2)_q$—, —C(=O)—, —$SO_2$—, —O—, and —S—; and Q is an integer of 1 to 5).

Among these, from the standpoint of, for example, capability to produce a polyimide resin having various characteristics, such as solubility in various organic solvents, heat resistance, compatibility with the epoxy resin component (B) and the polyimide resin(C), and dielectric characteristics, while achieving a good balance among these characteristics; and ease of availability, 4,4'-(4,4'-isopropylidenediphenoxy) bisphthalic dianhydride represented by the following general formula:

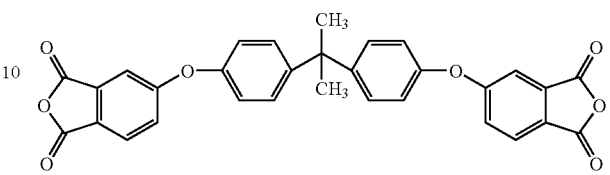

is particularly preferably used as the acid dianhydride.

For the synthesis of the polyimide resin, an acid dianhydride component containing at least one acid dianhydride selected from the above-described acid dianhydrides having a structure represented by general formula (3) described above should be used. That is, among the acid anhydrides described above, the acid dianhydride component may contain one acid anhydride alone or at least two acid anhydrides at any desired ratio. In addition, the acid dianhydride component may contain an acid dianhydride having a structure other than that represented by general formula (3) described above (hereinafter referred to as "other acid dianhydrides").

The content of the acid dianhydride having a structure represented by general formula (3) in the acid dianhydride component is preferably 50 mol % or more for the total content of the acid dianhydrides in the acid dianhydride component. When the content is 50 mol % or more, a polyimide resin having satisfactory solubility in various organic solvents, compatibility with the imide oligomer component (A) and the epoxy resin component (B), and dielectric characteristics can be produced.

Among the acid dianhydrides contained in the acid dianhydride component, other acid dianhydrides each having a structure other than that represented by general formula (3) described above are not particularly limited but are preferably aromatic tetracarboxylic dianhydrides each having a structure other than that represented by general formula (3) described above.

Examples of the above-described other acid dianhydrides include anhydrides of pyromellitic acid, 1,2,3,4-benzenetetracarboxylic acid, 1,2,3,4-cyclobutanetetracarboxylic acid, 1,2,4,5-cyclopentanetetracarboxylic acid, 1,2,4,5-cyclohexanetetracarboxylic acid, 3,3',4,4'-bicyclohexyltetracarboxylic acid, 2,3,5-tricarboxycyclopentylacetic acid, 3,4-dicarboxy-1, 2,3,4-tetrahydronaphthalene-1-succinic acid, bis (3,4-dicarboxyphenyl)methane, bis(2,3-dicarboxyphenyl) methane, 1,1-bis(2,3-dicarboxyphenyl)ethane, 3,3',4,4'-diphenylsulfonetetracarboxylic acid, 2,3,3',4'-diphenylsulfonetetracarboxylic acid, 2,3,6,7-naphthalenetetracarboxylic acid, 1,4,5,8-naphthalenetetracarboxylic acid, 1, 2,5,6-naphthalenetetracarboxylic acid, 3,4,9,10-tetracarboxyperylene acid, 2,2-bis[4-(3,4-dicarboxyphenoxy)phenyl]propanoic acid, 2,2-bis[4-(3,4-dicarboxyphenoxy)phenyl]hexafluoropropanoic acid, 3,3',4,4'-dimethyldiphenylsilanetetracarboxylic acid, 1,2,3,4-furantetracarboxylic acid, 4,4'-bis(3, 4-dicarboxyphenoxy)diphenylpropanoic acid, 4,4'-hexafluoroisopropylidenediphthalic acid, and p-phenylenediphthalic acid, and their lower alkyl esters. Of course, the other acid dianhydrides are not limited to these.

The above-described other acid dianhydrides may be used alone or in combination of two or more at any desired ratio.

(Diamine Component Used for Manufacture of Polyamic Acid)

As a diamine contained in the diamine component used for synthesizing the polyamic acid described above, a diamine capable of forming a polyimide resin having satisfactory solubility in various organic solvents, high heat resistance, excellent resistance to soldering heat, outstanding PCT resistance, low water absorption, satisfactory thermoplasticity, and the like is preferred. An aromatic diamine is preferable. To be specific, the above-described diamine preferably has a structure represented by general formula (8):

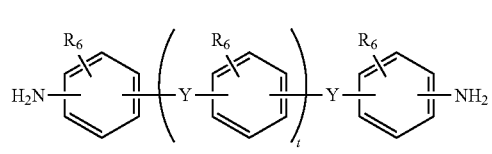

(8)

(wherein Ys independently represent a divalent group selected from the group consisting of —C(=O)—, —SO$_2$—, —O—, —S—, —(CH$_2$)$_u$—, —NHCO—, —C(CH$_3$)$_2$—, —C(CF$_3$)$_2$—, and —C(=O)O—, or a direct bond; R$_6$s independently represent hydrogen, halogen, or an alkyl group having 1 to 4 carbon atoms; and t and u independently represent an integer of 1 to 5). The term "direct bond" means that two benzene rings are bonded by directly bonding carbon atoms contained in the respective two benzene rings.

Examples of the diamine having a structure represented by general formula (8) include bis[(aminophenoxy)phenyl]alkanes such as bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, and 2,2-bis[4-(3-aminophenoxy)phenyl]butane; bis[(aminophenoxy)phenyl]fluoroalkanes such as 2,2-bis[3-(3-aminophenoxy)phenyl]-1,1,1,3,3,3-hexafluoropropane and 2,2-bis[4-(4-aminophenoxy)phenyl]-1,1,1,3,3,3-hexafluoropropane; bis(aminophenoxy)benzene compounds such as 1,3-bis(3-aminophenoxy)benzene, 1,4-bis(3-aminophenoxy)benzene, 1,4'-bis(4-aminophenoxy) benzene, and 4,4'-bis(4-aminophenoxy)biphenyl; bis(aminophenoxy)ketone compounds such as bis[4-(3-aminophenoxy)phenyl]ketone and bis[4-(4-aminophenoxy)phenyl]ketone; bis[(aminophenoxy)phenyl]sulfide compounds such as bis[4-(3-aminophenoxy)phenyl]sulfide and bis[4-(4-aminophenoxy)phenyl]sulfide; bis[(aminophenoxy)phenyl]sulfone compounds such as bis[4-(3-aminophenoxy)phenyl]sulfone and bis[4-(4-aminophenoxy)phenyl]sulfone; bis[(aminophenoxy)phenyl]ether compounds such as bis[4-(3-aminophenoxy)phenyl]ether and bis[4-(4-aminophenoxy)phenyl]ether; bis[(aminophenoxy)benzoyl]benzene compounds such as 1,4-bis[4-(3-aminophenoxy)benzoyl]benzene and 1,3-bis[4-(3-aminophenoxy)benzoyl]benzene; bis[(aminophenoxy)benzoyl]diphenyl ether such as 4,4'-bis[3-(4-aminophenoxy)benzoyl]diphenyl ether and 4,4'-bis[3-(3-aminophenoxy)benzoyl]diphenyl ether; benzophenone compounds such as 4,4'-bis[4-(4-amino-α,α-dimethylbenzyl)phenoxy]benzophenone; (phenoxy)phenyl sulfone compounds such as 4,4'-bis[4-(4-amino-α,α-dimethylbenzyl)phenoxy]diphenyl sulfone and bis[4-{4-(4-aminophenoxy)phenoxy}phenyl]sulfone; and bis[(aminophenoxy)dimethylbenzene]benzene compounds such as 1,4-bis[4-(4-aminophenoxy)-α,α-dimethylbenzyl]benzene and 1,3-bis[4-(4-aminophenoxy)-α,α-dimethylbenzyl]benzene.

Among the diamines each having a structure represented by general formula (8), a diamine having an amino group at the meta position is more preferable. In the case of the use of the diamine having an amino group at the meta position, it is possible to obtain a polyimide resin having more satisfactory solubility in various organic solvents compared with the case of the use of the diamine having an amino group at the para position. The diamine having an amino group at the meta position has a structure represented by general formula (9):

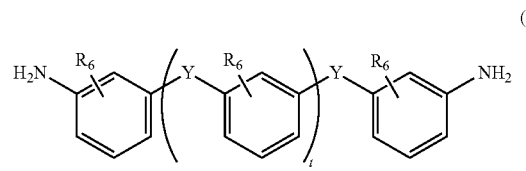

(9)

(wherein Ys independently represent a divalent group selected from the group consisting of —C(=O)—, —SO$_2$—, —O—, —S—, —(CH$_2$)$_u$—, —NHCO—, —C(CH$_3$)$_2$—, —C(CF$_3$)$_2$—, and —C(=O)O—, or a direct bond; Rs independently represent hydrogen, halogen, or an alkyl group having 1 to 4 carbon atoms; and t and u independently represent an integer of 1 to 5).

Examples of the diamine having a structure represented by general formula (9) include, among the above-described diamines, 1,1-bis[4-(3-aminophenoxy)phenyl]ethane, 1,2-bis[4-(3-aminophenoxy)phenyl]ethane, 2,2-bis[4-(3-aminophenoxy)phenyl]propane, 2,2-bis[4-(3)-aminophenoxy)phenyl]butane, 2,2-bis[3-(3-aminophenoxy)phenyl]-1,1,1,3,3,3-hexafluoropropane, 1,3-bis(3-aminophenoxy)benzene, 1,4-bis(3-aminophenoxy)benzene, bis[4-(3-aminophenoxy)phenyl]ketone, bis[4-(3-aminophenoxy)phenyl]sulfide, bis[4-(3-aminophenoxy)phenyl]sulfone, bis[4-(3-aminophenoxy)phenyl]ether, 1,4-bis[4-(3-aminophenoxy)benzoyl]benzene, 1,3-bis[4-(3-aminophenoxy)benzoyl]benzene, and 4,4'-bis[3-(3-aminophenoxy)benzoyl]diphenyl ether. Among these, 1,3-bis(3-aminophenoxy)benzene is particularly preferably used. In the case of the use of 1,3-bis(3-aminophenoxy)benzene, it is possible to provide a thermosetting resin composition having satisfactory solubility in various organic solvents, excellent resistance to soldering heat, and outstanding PCT resistance.

Alternatively, a diamine having a hydroxyl group and/or carboxyl group may be used as a diamine contained in the diamine component. When a polyamic acid is produced using the diamine having a hydroxyl group and/or a carboxyl group, and then a polyimide resin is produced, it is possible to obtain the polyimide resin having a hydroxyl group and/or carboxyl group.

The polyimide resin having a hydroxyl group and/or carboxyl group can promote the curing of the epoxy resin component (B). Therefore, the thermal curing of the epoxy resin component (B) can be performed at low temperature or for a short time. Furthermore, since the epoxy resin component (B) reacts with the hydroxyl group and/or carboxyl group, the polyimide resins are cross-linked to each other via the epoxy resin contained in the epoxy resin component (B). Therefore, to obtain such a polyimide resin having a hydroxyl group and/or carboxyl group, use of the diamine having a hydroxyl group and/or carboxyl group as the diamine described above results in a thermosetting resin composition having more satisfactory heat resistance, resistance to soldering heat, PCT resistance, and the like.

The diamine having a hydroxyl group and/or carboxyl group is not particularly limited as long as the diamine has a hydroxyl group and/or carboxyl group. Examples thereof include diaminophenol compounds such as 2,4-diaminophenol; diaminobiphenyl compounds such as 3,3'-dihydroxy-4,4'-diaminobiphenyl; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; hydroxydiphenylalkanes such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane, and 4,4'-diamino-2,2',5,5'-tetrahydroxydiphenylmethane; hydroxydiphenyl ether compounds such as 3,3'-diamino-4,4'-dihydroxydiphenyl ether, 4,4'-diamino-3,3'-dihydroxydiphenyl ether, 4,4'-diamino-2,2''-dihydroxydiphenyl ether, and 4,4'-diamino-2,2',5,5'-tetrahydroxydiphenyl ether; diphenyl sulfone compounds such as 3,3'-diamino-4,4'-dihydroxydiphenyl sulfone, 4,4'-diamino-3,3'-dihydroxydiphenyl sulfone, 4,4'-diamino-2,2'-dihydroxydiphenyl sulfone, and 4,4'-diamino-2,2',5,5'-tetrahydroxydiphenyl sulfone; bis[(hydroxyphenyl)phenyl]alkanes such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; bis[(hydroxyphenoxy)phenyl]sulfone compounds such as 2,2-bis[4-(4-amino-3-hydroxyphenoxy)phenyl]sulfone; diaminobenzoic acids such as 3,5-diaminobenzoic acid; carboxybiphenyl compounds such as 3,3'-diamino-4,4'-dicarboxybiphenyl, 4,4'-diamino-3,3'-dicarboxybiphenyl, 4,4'-diamino-2,2'-dicarboxybiphenyl, and 4,4'-diamino-2,2',5,5'-tetracarboxybiphenyl; carboxydiphenylalkanes, for example, carboxydiphenylmethanes, such as 3,3'-diamino-4,4'-dicarboxydiphenylmethane, 4,4'-diamino-3,3'-dihydroxydiphenylmethane, 4,4'-diamino-2,2'-dihydroxydiphenylmethane, 2,2-bis[4-amino-3-carboxyphenyl]propane, 2,2-bis[3-amino-4-carboxyphenyl]hexafluoropropane, and 4,4'-diamino-2,2',5,5'-tetracarboxydiphenylmethane; carboxydiphenyl ether compounds such as 3,3'-diamino-4,4'-dicarboxydiphenyl ether, 4,4'-diamino-3,3'-dicarboxydiphenyl ether, 4,4'-diamino-2,2'-dicarboxydiphenyl ether, and 4,4'-diamino-2,2',5,5'-tetracarboxydiphenyl ether; diphenyl sulfone compounds such as 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, and 4,4'-diamino-2,2',5,5'-tetracarboxydiphenyl sulfone; bis[(carboxyphenyl)phenyl]alkanes such as 2,2-bis[4-(4-amino-3-carboxyphenoxy)phenyl]propane; bis(hydroxyphenoxy)biphenyl compounds such as 4,4'-bis(4-amino-3-hydroxyphenoxy)biphenyl; and bis[(carboxyphenoxy)phenyl]sulfone compounds such as 2,2-bis[4-(4-amino-3-carboxyphenoxy)phenyl]sulfone.

Among these, to achieve satisfactory resistance to soldering heat and PCT resistance, 3,3'-dihydroxy-4,4'-diaminobiphenyl represented by the following formula:

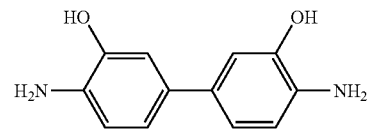

is particularly preferably used as the diamine having a hydroxyl group and/or carboxyl group.

When a polyimide resin is synthesized, a diamine component containing at least one diamine having a structure represented by general formula (8) described above and/or at least one diamine having a hydroxyl group and/or carboxyl group is preferably used.

When the diamine component contains the diamine having a structure represented by general formula (8) described above, the content of the diamine (general formula (8)) is preferably 60 mol % to 99 mol % for the total amount of diamines in the diamine component. When the diamine component contains the diamine having a hydroxyl group and/or carboxyl group, the content of the diamine (having a hydroxyl group and/or carboxyl group) is preferably 1 mol % to 40 mol % for the total amount of diamines in the diamine component.

More preferably, the above-described diamine component contains at least one diamine having a structure represented by general formula (8) and at least one diamine having a hydroxyl group and/or carboxyl group. In particular, 3,3'-dihydroxy-4,4'-diaminobiphenyl is most preferably used as the diamine having a hydroxyl group and/or carboxyl group. This can achieve more satisfactory resistance to soldering heat and PCT resistance.

The diamines contained in the diamine component can be combined at any desired ratio. The content of the diamine having a structure represented by general formula (8) in the diamine component is preferably at least 60 mol % or 99 mol % or more for the total amount of diamines, and the content of the at least one diamine having a hydroxyl group and/or carboxyl group in the diamine component is preferably 1 mol % to 40 mol % for the total amount of diamines. When the contents of the diamine having a structure represented by general formula (8) and the diamine having a hydroxyl group and/or carboxyl group are out of the range described above, the solubility in various organic solvents, resistance to soldering heat, and PCT resistance of a polyimide resin obtained using the diamines may be impaired.

Furthermore, the diamine component may contain a diamine other than the above-described diamines (the diamine having a structure represented by general formula (8) and the diamine having a hydroxyl group and/or carboxyl group) (hereinafter referred to as "other diamines"). The other diamines contained in the above-described diamine component are not particularly limited but are preferably aromatic diamines.

Examples of the aromatic diamine include m-phenylenediamine, o-phenylenediamine, p-phenylenediamine, m-aminobenzylamine, p-aminobenzylamine, bis(3-aminophenyl)sulfide, (3-aminophenyl) (4-aminophenyl)sulfide, bis(4-aminophenyl)sulfide, bis(3-aminophenyl)sulfoxide, (3-aminophenyl) (4-aminophenyl)sulfoxide, bis(3-aminophenyl)sulfone, (3-aminophenyl) (4-aminophenyl)sulfone, bis(4-aminophenyl)sulfone, 3,4'-diaminobenzophenone, 4,4'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenyl ether, 3,4'-diaminodiphenyl ether, bis[4-(3-aminophenoxy)phenyl]sulfoxide, and bis[4-(aminophenoxy)phenyl]sulfoxide.

The above-described other diamines should be used alone or in combination of two or more. The content of other diamines in the diamine component is preferably less than 10 mol % for the total amount of diamines.

(Imidization of Polyamic Acid)

To obtain the soluble polyimide resin using the polyamic acid solution containing the polyamic acid described above, a process for imidizing the above-described polyamic acid will be described. The imidization is performed by, for example, a thermal process or a chemical process for dehydrating the polyamic acid in the polyamic acid solution. The term "thermal process" means a process for dehydrating by heating. The term "chemical process" means a process for dehydrating with a dehydrating agent. In addition to these processes, a process for imidizing the polyamic acid by heating under reduced pressure may be employed. These processes will be described below.

An example of the dehydration by the thermal process is a process for promoting the imidization reaction by heating the polyamic acid solution while evaporating the solvent. By employing this thermal process, it is possible to obtain a solid polyimide resin. The heating conditions are not particularly limited. The heating is preferably performed at a temperature of 300° C. or less for about 5 to 20 minutes.

On the other hand, an example of the dehydration by the chemical process is a process for performing a dehydrating reaction and evaporation of the organic solvent by adding a catalyst and at least the stoichiometric amount of a dehydrating agent to the polyamic acid solution. It is possible to obtain a solid polyimide resin by this chemical process.

Examples of the dehydrating agent include aliphatic acid anhydride such as acetic anhydride; aromatic acid anhydride such as benzoic anhydride; and carbodiimides such as N,N'-dicyclohexylcarbodiimide and N,N'-diisopropylcarbodiimide. Examples of the catalyst include aliphatic tertiary amines such as triethylamine; aromatic tertiary amines such as dimethylaniline; and heterocyclic tertiary amines such as pyridine, α-picoline, β-picoline, γ-picoline, and isoquinoline. With respect to the temperature conditions in the dehydration by the chemical process, the temperature is preferably 100° C. or less. The reaction time is preferably in the range of about 1 minute to 50 hours. The evaporation of the organic solvent is preferably performed at 200° C. or less for about 5 to 120 minutes.

In the above-described thermal process and chemical process, the processes for evaporating the solvents are described. Alternatively, a process in which a solvent is not evaporated may be employed. To be specific, the process is as follows: a polyimide resin solution obtained by the thermal process or the chemical process is added to a poor solvent to precipitate the polyimide resin, and then unreacted monomers (acid dianhydride and diamine) are removed, followed by purification and drying to obtain a solid polyimide resin. The poor solvent is not particularly limited as long as the poor solvent is satisfactory mixed with the solvent used for the polyimide resin solution but is difficult to dissolve the polyimide resin. Examples thereof include acetone, methanol, ethanol, isopropanol, benzene, Methyl Cellosolve (registered trademark), and methylethylketone.

In a process for imidizing the polyamic acid by heating under reduced pressure, the heating temperature should be 80° C. to 400° C. To achieve efficient imidization and dehydration, the heating temperature is 100° C. or more and more preferably 120° C. or more. The maximum temperature in the heating is preferably up to the thermal decomposition temperature of the polyimide resin and, in general, is set in the range of about 250° C. to 350° C. at which imidization is completed. With respect to the pressure conditions, a low pressure is preferable. To be specific, the pressure is preferably in the range of 0.001 atm to 0.9 atm, more preferably 0.001 atm to 0.8 atm, and most preferably 0.001 atm to 0.7 atm.

According to the above-described process for imidizing the polyamic acid by heating under reduced pressure, water formed during the imidization can be actively removed from the system, thereby suppressing the hydrolysis of the polyamic acid. As a result, it is possible to obtain a polyimide resin having a high molecular weight. Furthermore, by employing this process, it is possible to cyclizing a compound having an open-circular form at one end or a compound having an open-circular form at both ends, these compounds being impurities contained in the acid dianhydride serving as a raw material for the polyamic acid. Therefore, the molecular weight of the polyimide resin can be further increased.

(D) Additional Component

The thermosetting resin composition of the present invention may contain a thermally curing component and the like, as required, in addition to the imide oligomer component (A), for example, the thermally curing component including a curing agent (D-1) for the epoxy resin component and a curing accelerator (D-2) for accelerating the reaction between the epoxy resin component and the curing agent.

Examples of the curing agent include, but are not limited to, phenol resins such as phenol novolac-type phenol resins, cresol novolac-type phenol resins, and naphthalene-type phenol resins; aliphatic acid anhydrides such as dodecylsuccinic anhydride, poly(adipic anhydride), and poly(azelaic anhydride); alicyclic acid anhydrides such as hexahydrophthalic anhydride and methylhexahydrophthalic acid; aromatic acid anhydrides such as phthalic anhydride, trimellitic anhydride, benzophenonetetracarboxylic acid, ethylene glycol bistrimellitate, and glycerol tristrimellitate; amino resins; urea resins; melamine resins; dicyandiamide; dihydrazine compounds; imidazole compounds; salts of Lewis acids and Bronsted acids; polymercaptan compounds; isocyanate and blocked isocyanate compounds.

The above-described curing agents may be used alone or in combination of two or more. The curing agent is preferably used in an amount of 1 part by weight to 100 parts by weight for 100 parts by weight of the entire epoxy resin.

Examples of the curing accelerator include, but are not limited to, phosphine compounds such as triphenylphoshine; amine compounds such as tertiary amines, trimethanolamine, triethanolamine, and tetraethanolamine; borate compounds such as 1,8-diazabicyclo[5,4,0]-7-undecenium tetraphenyl borate; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, and 2-phenyl-4-methylimidazole; imidazolines such as 2-methylimidazoline, 2-ethylimidazoline, 2-isopropylimidazoline, 2-phenylimidazoline, 2-undecylimidazoline, 2,4-dimethylimidazoline, and 2-phenyl-4-methylimidazoline; and azine imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. When the imide oligomer contains an amino group, imidazoles such as 2-ethyl-4-methylimidazole, 2-phenyl-4-methylimidazole, and 2,4-diamino-6-[2'-undecylimidazolyl-(1')]-ethyl-s-triazine are preferably used in view that, in particular, the lowest melt viscosity of the thermosetting resin composition is significantly decreased, thereby improving circuit embedding properties.

The above-described curing accelerators may be used alone or in combination of two or more. The curing accelerator is preferably used in an amount of 0.01 part by weight to 10 parts by weight for 100 parts by weight of the entire thermosetting resin composition.

Furthermore, examples of the above-described thermally curing component usable include, in order to improve various characteristics, such as adhesiveness, heat resistance, and processability, of the thermosetting resin composition or a cured resin of the thermosetting resin composition, thermosetting resins such as bismaleimide resins, bisallylnadimide resins, acrylic resins, methacrylic resins, resins capable of being cured by hydrosilylation, curable allyl resins, and unsaturated polyester resins; and reactive side-chain group-containing thermosetting polymers having reactive groups, such as an allyl group, a vinyl group, an alkoxysilyl group, or a hydrosilyl group, in side chains or in termini of the molecular chain. The above-described thermally curing components may be used alone or in appropriate combination of two or more.

The curing agent, curing accelerator, and thermally curing component are preferably contained in the thermosetting resin composition within a range in which the curing agent, curing accelerator, and thermally curing component do not impair the dielectric characteristics of a cured resin obtained by curing the thermosetting resin composition.

Embodiments according to the thermosetting resin composition of the present invention will be described below, but are not limited to the following description.

The thermosetting resin composition of the present invention may be used as a resin solution prepared by adding the thermosetting resin composition in an appropriate solvent, followed by stirring. Alternatively, the resin solution may be prepared by dissolving the components constituting the thermosetting resin composition in suitable solvents to prepare solutions of individual components, and then mixing these solutions.

The solvents that can be used for the resin solutions are not limited and may be any solvents that can dissolve the thermosetting resin composition or the components constituting the thermosetting resin composition. Preferably, the solvents each have a boiling point of 150° C. or less. Examples thereof suitably used include ethers, for example, cyclic ethers such as tetrahydrofuran, dioxolane, and dioxane; and linear ethers such as ethylene glycol dimethyl ether, triglyme, diethylene glycol, ethyl cellosolve, and Methyl Cellosolve. It is also preferable to use mixed solvents prepared by combining these ethers with toluene, xylene, glycols, N,N-dimethylformamide, N,N-dimethylacetamide, N-methylpyrrolidone, cyclic siloxanes, linear siloxanes, or the like.

Furthermore, the thermosetting resin composition of the present invention may be preliminarily formed into a sheet and then be used as a resin sheet. To be specific, for example, the resin sheet may be a one-layer sheet composed of only the thermosetting resin composition, a two-layer sheet including a base film and a resin layer composed of the thermosetting resin composition disposed on one of the film surfaces, a three-layer sheet including a base film and resin layers composed of the thermosetting resin composition on both film surfaces, or a multilayer sheet prepared by alternately stacking base films and resin layers composed of the thermosetting resin composition.

With respect to the resin sheet, the resin solution described above is flow-cast or applied on a surface of a support, and then the flow-cast or applied resin solution is dried to form a film. The film of the resulting thermosetting resin composition is in a semi-cured state (stage B). Thus, by separating the semi-cured film of the thermosetting resin composition, the one-layer sheet described above can be prepared. A procedure in which the resin solution described above is flow-cast or applied on a surface of the base film, and then the resin solution is dried is repeated to prepare the multilayer sheet described above.

With respect to the melt viscosity of the semi-cured resin in the thermosetting resin composition of the present invention, the lowest melt viscosity at a temperature selected in the range of 60° C. to 200° C. is preferably 100 poise to 80,000 poise.

At a melt viscosity exceeding 80,000 poise, circuit embedding properties are degraded. In contrast, at a melt viscosity less than 100 poise, the resin flows out of a board in large quantities during processing, thus reducing the amount of remaining resin on the board. As a result, the circuit cannot be embedded.

When the above-described base film is composed of a metal such as copper or aluminum, a metal-containing laminate can be produced. That is, the metal-containing laminate may be a laminate including at least one resin layer composed of the thermosetting resin composition and at least one metal layer. One or both surfaces of the metal layer may be covered with a resin layer. Alternatively, metal layers and resin layers may be alternately stacked.

The metal-containing laminate may be prepared by flow-casting or applying a resin solution on a surface of a metal layer and by drying the resin solution, as described above. A laminate may be also prepared by bonding the above-described resin sheet, a metal foil, and a resin sheet together. Alternatively, a laminate may be prepared by forming a metal layer by chemical plating, sputtering, or the like.

When the metal layer is composed of a metal usable as a conductor for the circuit board, the metal layer of the metal-containing laminate may be subjected to metal etching that uses a dry film resist, a liquid resist, or the like to form a circuit having a desired pattern (hereinafter, patterned circuit). Thus, a circuit board, such as a flexible printed circuit board or a build-up circuit board, can be prepared by forming a patterned circuit in the metal layer of the metal-containing laminate and providing a resin layer composed of the thermosetting resin composition of the present invention.

The above-described semi-cured resin sheet may be used as the resin layer used for the metal layer having the patterned circuit. Since the semi-cured resin sheet composed of the thermosetting resin composition of the present invention has a moderate degree of flowability, when thermal press bonding, such as thermal press treatment, lamination (thermal lamination), or hot roll lamination, is conducted, the patterned circuit can be adequately embedded. As a result, the metal layer and the resin layer are bonded together.

The process temperature of the thermal press bonding is preferably in the range of 50° C. to 200° C., more preferably 60° C. to 180° C., and most preferably 80° C. to 130° C. At a process temperature exceeding 200° C., the resin layer may be disadvantageously cured by thermal press bonding. At a process temperature less than 50° C., the flowability of the resin layer is low, and it is difficult to embed the patterned circuit.

The resin layer on the patterned circuit serves as a protective material for protecting the patterned circuit or as an interlayer insulating material in a multilayer circuit board.

Thus, after embedding the patterned circuit, it is preferable to completely cure the resin layer by exposure treatment, thermal curing, or the like.

In order to cure the thermosetting resin composition of the present invention, post-heating is preferably performed after bonding of the metal layer to the resin layer to allow curing reaction of the epoxy resin component (B) to progress sufficiently. The conditions of the post-heating are not particularly limited. Preferably, the post-heating is performed at 150° C. to 200° C. for 10 minutes to 3 hours.

In addition to the above, vanish of the thermosetting resin composition of the present invention may be used to impregnate into various fibers of a glass cloth, a glass mat, an aromatic polyamide textile fabric, and an aromatic polyamide textile mat. By semi-curing the thermosetting resin composition impregnating into the fibers, a fiber-reinforced resin sheet can be prepared.

EXAMPLES

The present invention will be described in further detail by way of Examples and Comparative examples, but is not limited to these. Persons skilled in the art may apply various changes, modifications, and alternations without departing from the spirit of the present invention.

The flowability, laminatability, and volatile component content of a resin sheet composed of the thermosetting resin composition were calculated as described below. The dielectric characteristics and the glass transition temperature of a cured resin sheet prepared by thermally curing the resin sheet were measured and evaluated as below.

[Weight-Average Molecular Weight]

The weight-average molecular weight was measured by gel permeation chromatography with an apparatus HLC-8220GPC (apparatus name, manufactured by Tosoh Corporation) under the following conditions.
Column: Two TSK gel Super AWM-H (trade name, manufactured by Tosoh Corporation) coupled in series
Detector: IR (infrared absorption) method
Mobile phase: DMF containing 0.02 mol/l of phosphoric acid and 0.03 mol/l of lithium bromide
Sample solution: 1 mg/mL of solution containing mobile phase as its solvent
Column temperature: 40° C.
Elution rate: 0.6 mL/min
Standard: polystyrene

[Flowability]

Using a shear-mode dynamic viscoelasticity meter (CVO manufactured by Bohling Corp.), the complex viscosity (Pa·s) of the resin sheet before thermal curing was measured under conditions described below and converted into melt viscosity (poise). The evaluation of the melt viscosity of each resin sheet was conducted for the lowest melt viscosity in the temperature range of 60° C. to 200° C.
Measurement frequency: 1 Hz
Heating rate: 12° C./min
Test specimen: A circular resin sheet 3 mm in diameter

[Laminatability]

A resin sheet (50 μm in thickness) was interposed between a glossy surface of a copper foil (BHY22BT, manufactured by Japan Energy Corporation) and a circuit-carrying surface of a glass epoxy substrate FR-4 (MCL-E-67, manufactured by Hitachi Chemical Co., Ltd.; thickness of copper foil: 50 μm, the total thickness: 1.2 mm) including a circuit having a height of 18 μm, a circuit line width of 50 μm, and a line spacing of 50 μm so as to make direct contact with these surfaces. Thermal pressing was conducted at 180° C. under a pressure of 3 MPa for 1 hour to prepare a laminate. The copper foil of the laminate was chemically removed with an iron(III) chloride-hydrochloric acid solution. The exposed surface of the resin sheet was visually observed with an optical microscope (×50 magnification) to confirm whether bubbles are present between the circuit lines.

The laminatability was evaluated as "pass (P)" when no bubbles were observed between circuit lines, i.e., when the space between circuit lines was completely filled with resin. The laminatability was evaluated as "fail (F)" when bubbles were observed between the circuit lines.

[Calculation of Volatile Component Content in Resin Sheet]

Using a mass analyzer (TGA50, manufactured by Shimadzu Corporation), a resin sheet was placed in a sample container, and changes in weight were observed under the conditions below. The volatile component content was determined as the ratio of the decrease in weight in the temperature range of 100° C. to 300° C. to the weight of the resin sheet before the change.
Measurement temperature range: 15° C. to 350° C.
Heating rate: 20° C./min
Measurement atmosphere: Nitrogen, flow: 50 mL/min.
Sample container: composed of aluminum

[Dielectric Characteristics]

Using a cavity resonator for complex permittivity measurement by perturbation method (manufactured by Kanto Electronics Application and Development Inc.), the permittivity and loss tangent of the cured resin sheet were measured under the following conditions:
Measurement frequency: 3 GHz, 5 GHz, and 10 GHz
Measurement temperature: 22° C. to 24° C.
Measurement humidity: 45% to 55%
Test piece: a resin sheet left to stand for 24 hours at the above-described measurement temperature and humidity

[Glass Transition Temperature]

Using an analyzer DMS-200 (manufactured by Seiko Instruments & Electronics Ltd.), the storage modulus ($\in'$) of a cured resin sheet was measured at a measurement length (fixture gap) of 20 mm under the conditions described below, and the inflection point of the storage modulus ($\in'$) was defined as the glass transition temperature (° C.):
Measurement atmosphere: dry air atmosphere
Measurement temperature: 20° C. to 400° C.
Test piece: cured resin sheet strip having a width of 9 mm and a length of 40 mm Synthetic Example 1 of Imide Oligomer Into a 2,000 mL glass flask charged with 1293.2 g of dimethylformamide (hereinafter, referred to as "DMF"), 346 g (0.8 mol) of bis[4-(3-aminophenoxy)phenyl] sulfone (manufactured by Wakayama Seika Kogyo Co., Ltd.) was fed and dissolved in a nitrogen atmosphere under stirring to prepare a DMF solution. Subsequently, after the flask was purged with nitrogen, the DMF solution was cooled in an ice bath under stirring, and 208.2 g (0.4 mol) of 4,4'-(4,4'-isopropylidenediphenoxy)bisphthalic anhydride (manufactured by GE Corporation, hereinafter referred to as "IPBP") was added thereto. The resulting mixture was stirred further for two hours to obtain an amic acid oligomer solution.

Next, 300 g of the amic acid oligomer solution was placed in a vat coated with a fluorocarbon resin and vacuum-heated at 200° C. at a pressure of 5 mmHg (about 0.007 atm, about 5.65 hPa) in a vacuum oven for three hours to obtain an amino group-containing imide oligomer (calculative amine value:

337.4 g/eq, hereinafter referred to as "oligomer A") having a weight-average molecular weight of 1,451.

Synthetic Example 2 of Imide Oligomer

Into a 2,000 mL glass flask charged with 400 g of DMF, 104.1 g (0.2 mol) of IPBP was fed and dissolved in a nitrogen atmosphere under stirring to prepare a DMF solution. Subsequently, the flask was purged with nitrogen, and 25.8 g (0.1 mol) of 3,3'-diamino-4,4'-dihydroxydiphenylmethane (manufactured by Gun Ei Chemical Industry Co., Ltd., hereinafter referred to as "DAM-1") was added thereto while the DMF solution was cooled in an ice bath under stirring. The resulting mixture was stirred further for one hour. Next, 21.8 g (0.2 mol) of 3-aminophenol (manufactured by Wako Pure Chemical Industries, Ltd.) was added thereto. The resulting mixture was stirred further for two hours to obtain an amic acid oligomer solution.

Next, 300 g of the amic acid oligomer solution was placed in a vat coated with a fluorocarbon resin and a vacuum-heated at 200° C. at a pressure of 5 mmHg (about 0.007 atm, about 5.65 hPa) in a vacuum oven for three hours to obtain a hydroxyl group-containing imide oligomer (calculative hydroxyl value: 370.4 g/eq, hereinafter referred to as "oligomer B") having a weight-average molecular weight of 1,478.

Synthetic Example 3 of Imide Oligomer

Into a 2,000 mL glass flask charged with 400 g of DMF, 104.1 g (0.2 mol) of IPBP was fed and dissolved in a nitrogen atmosphere under stirring to prepare a DMF solution. Subsequently, the flask was purged with nitrogen, and 10.8 g (0.1 mol) of 1,3-phenylenediamine (manufactured by Wako Pure Chemical Industries, Ltd.) was added thereto while the DMF solution was cooled in an ice bath under stirring. The resulting mixture was stirred further for one hour. Next, 21.8 g (0.2 mol) of 3-aminophenol (manufactured by Wako Pure Chemical Industries, Ltd.) was added thereto. The resulting mixture was stirred further for two hours to obtain an amic acid oligomer solution.

Next, 300 g of the amic acid oligomer solution was placed in a vat coated with a fluorocarbon resin and a vacuum-heated at 200° C. at a pressure of 5 mmHg (about 0.007 atm, about 5.65 hPa) in a vacuum oven for three hours to obtain a hydroxyl group-containing imide oligomer (calculative hydroxyl value: 313.3 g/eq, hereinafter referred to as "oligomer C") having a weight-average molecular weight of 1,254.

Synthetic Example of Polyimide Resin

Into a 2,000 mL glass flask charged with 1,480 g of DMF, 292 g (1 mol) of 1,3-bis(3-aminophenoxy)benzene (manufactured by Mitsui Chemicals, Inc., hereinafter referred to as "APB") and 8.64 g (0.04 mol) of 3,3'-dihydroxy-4,4'-diaminobiphenyl (manufactured by Wakayama Seika Kogyo Co., Ltd.) were fed and dissolved in a nitrogen atmosphere under stirring to prepare a DMF solution. Subsequently, after the flask was purged with nitrogen, the DMF solution was cooled in an ice bath under stirring, and 541.3 g (1.04 mol) of 4,4'-(4,4'-isopropylidenediphenoxy)bisphthalic anhydride (manufactured by GE Corporation, hereinafter referred to as "IPBP") was added thereto. The resulting mixture was stirred further for three hours to obtain a polyamic acid solution. Next, 300 g of the polyamic acid solution was placed to a vat coated with a fluorocarbon resin and vacuum-heated at 200° C. at a pressure of 5 mmHg (about 0.007 atm, about 5.65 hPa) in a vacuum oven for three hours to obtain a polyimide resin (PI).

Example 1

The polyimide resin prepared above, a crystalline biphenyl-type epoxy resin (YX4000H manufactured by Japan Epoxy Resin Co., Ltd., melting point: about 106° C.; epoxy value=194 g/eq) as an epoxy resin, the imide oligomer A prepared by synthetic example 1, and 2,4-diamino-6-[2'-undecylimidazolyl-(1')]-ethyl-s-triazine (Curezole C11Z-A manufactured by Shikoku Chemicals Co., Ltd.) as imidazole were dissolved in dioxolane at the mixture ratio shown in Table 1 to prepare a resin solution.

The resulting resin solution was flow-cast on a surface of a PET film (trade name: Cellapeel HP, manufactured by Toyo Metallizing Co., Ltd.) serving as a support and having a thickness of 125 μm. The cast resin was heat-dried in a hot-air oven at 60° C., 80° C., 100° C., 120° C., and 140° C. for three minutes each to prepare a two-layer sheet having the PET film as a film base. From this two-layer sheet, the PET film was removed to obtain a one-layer sheet. The thickness of the one-layer resin sheet (before thermal curing) was 50 μm. The resin flowability, laminatability, and volatile component content of the resulting resin sheet (before thermal curing) were evaluated according to the above-described evaluation process. The results are shown in Table 3.

The resin sheet was then interposed between rolled copper foils (BHY-22B-T, manufactured by Japan Energy Corporation) having a thickness of 18 μm so that the resin sheet came into contact with the roughened surface of the rolled copper foils. The resin sheet and the foils were thermally pressed for 1 hour at 180° C. and a pressure of 3 MPa to prepare a copper foil laminate (constituted from the rolled copper foils and the one-layer resin sheet interposed therebetween). The copper foils were removed from the resulting copper foil laminate by etching to obtain a cured resin sheet. The dielectric characteristics and the glass transition temperature of the cured resin sheet were measured. The results are shown in Table 4.

Examples 2 to 5

A resin sheet (before thermal curing) and a cured resin sheet prepared by curing this resin sheet were prepared as in EXAMPLE 1 except that the polyimide resin, epoxy resin, imide oligomer, and imidazole were compounded at a mixture ratio shown in Table 1. Note that in Table 1, YX4000H (manufactured by Japan Epoxy Resin Co., Ltd.) is a biphenyl-type epoxy resin, and C11Z-A (manufactured by Shikoku Chemicals Co., Ltd.) is 2,4-diamino-6-[2'-undecylimidazolyl-(1')]-ethyl-s-triazine.

The flowability, laminatability, and volatile content of the resulting resin sheet were evaluated. The dielectric characteristics and the glass transition temperature of the cured resin sheet were evaluated. The results are shown in Tables 3 and 4.

Comparative Example 1

A resin sheet (before thermal curing) and a cured resin sheet prepared by curing this resin sheet were prepared as in EXAMPLE 1 except that a phenol resin was used as a curing agent instead of the imide oligomer prepared above, and the polyimide resin, epoxy resin, phenol resin, and imidazole were compounded at the ratio shown in Table 2. The flowability, laminatability, and volatile content of the resulting resin sheet were evaluated. The dielectric characteristics and the glass transition temperature of the cured resin sheet were evaluated. The results are shown in Tables 2 and 3.

Comparative Example 2

An attempt was made to dissolve the polyimide resin prepared above, a crystalline biphenyl-type epoxy resin (YX4000H manufactured by Japan Epoxy Resin Co., Ltd., melting point: about 106° C.; epoxy value=194 g/eq) as an epoxy resin, imide oligomer C prepared by synthetic example 3, and 2,4-diamino-6-[2'-undecylimidazolyl-(1')]-ethyl-s-triazine (Curezole C11Z-A manufactured by Shikoku Chemicals Co., Ltd.) as imidazole, in dioxolane at the ratio shown in Table 1 to prepare a resin solution. However, since imide oligomer C was not dissolved in the solvent, the attempt was failed.

TABLE 1

| | EXAMPLES | | | | | | | |
|---|---|---|---|---|---|---|---|---|
| | 1 | 2 | 3 | 4 | 5 | 6 | 7 | 8 |
| Imide oligomer component (A) | A | A | | | B | C | | B |
| (Amine value/hydroxyl value) | (337.4) | (337.4) | | | (370.4) | (238.0) | | (370.4) |
| Amount used (g) | 57.1 | 22.2 | 47.2 | 61.7 | 32.8 | 55.0 | 65.6 | 65.6 |
| No. of moles of active hydrogen groups (mol) | 0.17 | 0.07 | 0.14 | 0.32 | 0.09 | 0.23 | 0.18 | 0.18 |
| Epoxy resin component (B) | | | | | YX4000H | | | |
| (Epoxy value) | | | | | (194) | | | |
| Amount used (g) | 32.9 | 12.8 | 52.8 | 39.3 | 17.2 | 45.0 | 34.4 | 13.6 |
| No. of moles of epoxy groups (mol) | 0.17 | 0.07 | 0.27 | 0.20 | 0.09 | 0.23 | 0.18 | 0.18 |
| Polyimide resin component (C) | PI prepared by synthetic example | — | — | — | PI prepared by synthetic example | — | — | PI prepared by synthetic example |
| Amount used (g) | 10 | 65 | 0 | 0 | 50 | 20 | 0 | 79.2 |
| (Additional component) | | | | | C11Z-A | | | |
| Amount used (g) | 2.0 | 2.0 | 2.0 | 2.0 | 1.0 | 2.0 | 1.0 | 2.0 |
| Mixing ratio | | | | | | | | |
| (C)/[(A) + (B)] [Mass ratio] | 0.1 | 1.86 | 0 | 0 | 1.0 | 0.2 | 0 | 1.0 |
| (A)/(B) [Molar ratio] | 1.0 | 1.0 | 0.5 | 1.6 | 1.0 | 1.0 | 1.0 | 2.5 |

YX4000H: biphenyl-type epoxy resin, produced by Japan Epoxy Resin Co., Ltd.
C11Z-A: 2,4-diamino-6-[2'-undecylimidazolyl-(1')]-ethyl-s-triazine, produced by Shikoku Chemicals Co., Ltd.

TABLE 2

| | COMPARATIVE EXAMPLE 1 |
|---|---|
| Imide oligomer component (A) | — |
| (Amine value/hydroxyl value) | |
| Amount used (g) | 0 |
| No. of moles of active hydrogen groups (mol) | 0 |
| Epoxy resin component (B) | YX4000H |
| (Epoxy value) | (194) |
| Amount used (g) | 32.6 |
| No. of moles of epoxy groups (mol) | 0.17 |
| Polyimide resin component (C) | PI prepared by synthetic example |
| Amount used (g) | 50 |
| (Curing agent component) (A') | PSM4324 |
| (Amine value/hydroxyl value) | (104) |
| Amount used (g) | 17.4 |
| No. of moles of active hydrogen groups (mol) | 0.17 |
| (Additional component) | C11Z-A |
| Amount used (g) | 0.5 |
| Mixing ratio | |
| (C)/[(A') + (B)] [Mass ratio] | 1.0 |
| (A')/(B) [Molar ratio] | 1.0 |

PSM4324: Novolac-type phenol resin
(manufactured by Gun Ei Chemical Industry Co., Ltd.)

TABLE 3

| | | Melt viscosity [poise] | Laminatability | Remaining volatile component content [percent by weight] |
|---|---|---|---|---|
| EXAMPLE | 1 | 520 | P | 2.5 |
| | 2 | 750 | P | 3.3 |
| | 3 | 320 | P | 2.2 |
| | 4 | 430 | P | 2.2 |
| | 5 | 950 | P | 3.8 |
| | 6 | 400 | P | 2.0 |
| | 7 | 80 | P | 1.5 |
| | 8 | 1050 | P | 2.8 |
| COMPARATIVE EXAMPLE | 1 | 92000 | F | 2.5 |

TABLE 4

| | | Glass transition temperature (° C.) | Dielectric characteristics (permittivity/dielectric loss tangent) | | |
|---|---|---|---|---|---|
| | | | Frequency: 3 GHz | Frequency: 5 GHz | Frequency: 10 GHz |
| EXAMPLE | 1 | 172 | 2.9/0.014 | 2.9/0.014 | 2.8/0.014 |
| EXAMPLE | 2 | 168 | 2.9/0.013 | 2.9/0.013 | 2.9/0.013 |
| EXAMPLE | 3 | 159 | 3.1/0.015 | 3.1/0.015 | 3.1/0.015 |
| EXAMPLE | 4 | 155 | 3.1/0.014 | 3.1/0.014 | 3.0/0.015 |
| EXAMPLE | 5 | 172 | 2.9/0.011 | 2.9/0.012 | 2.9/0.012 |
| EXAMPLE | 6 | 181 | 2.9/0.014 | 2.9/0.014 | 2.8/0.015 |
| EXAMPLE | 7 | 205 | 3.3/0.018 | 3.3/0.019 | 3.2/0.020 |
| EXAMPLE | 8 | 145 | 3.0/0.012 | 3.0/0.012 | 3.0/0.013 |
| COMPARATIVE EXAMPLE | 1 | 163 | 3.3/0.028 | 3.3/0.029 | 3.2/0.029 |

As a result of above, by producing a resin sheet using thermosetting resin composition essentially containing the imide oligomer (A) and epoxy resin (B), satisfactory flowability and laminatability can be obtained. Furthermore, a cured resin sheet having satisfactory dielectric characteristics and having a glass transition temperature at which heat resistance and flexibility are excellent can be obtained.

The invention claimed is:

1. A thermosetting resin composition comprising an imide oligomer component (A) comprising at least one imide oligomer represented by general formula (1):

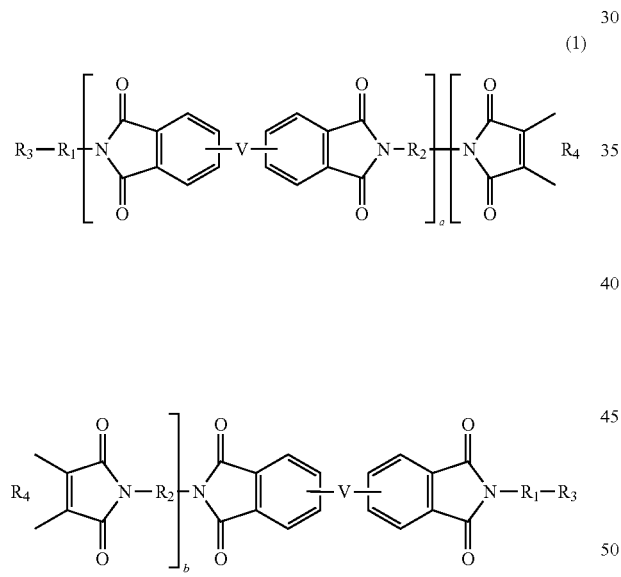

or general formula (2):

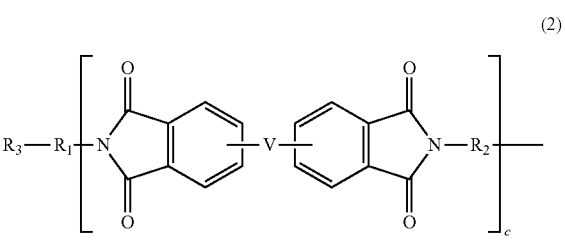

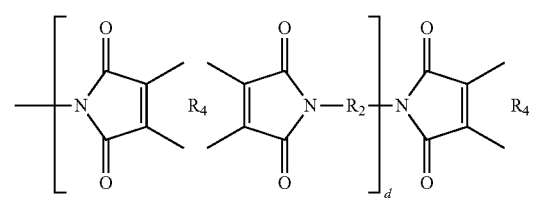

(wherein $R_1$s may be the same or different; $R_2$s may be the same or different, and each $R_2$s represents a divalent organic group containing at least two aromatic rings; $R_3$s may be the same or different, and each $R_3$s represents a monovalent organic group selected from —OH and —NH$_2$; $R_4$s may be the same or different, and each $R_4$s represents a tetravalent organic group containing at least one aromatic ring; V represents a direct bond or a divalent group selected from the group consisting of —O—, —CO—, —O-T-O—, —COO-T-OCO—, —C(CH$_3$)$_2$—, and —C(CF$_3$)$_2$—; T represents a divalent organic group; a and b independently represent an integer of 0 to 15; a+b represents an integer of 0 to 15; and the compound represented by general formula (1) may be a block copolymer or a random copolymer)

(wherein $R_1$s may be the same or different; $R_2$s may be the same or different, and each $R_2$s represents a divalent organic group containing at least two aromatic rings; $R_3$s may be the same or different, and each $R_3$s represents a monovalent organic group selected from —OH and —NH$_2$; $R_4$s may be the same or different, and each $R_4$s represents a tetravalent organic group containing at least one aromatic ring; V represents a direct bond or a divalent group selected from the group consisting of —O—, —CO—, —O-T-O—, —COO-T-OCO—, —C(CH$_3$)$_2$—, and —C(CF$_3$)$_2$—; T represents a divalent organic group; c is an integer of 1 to 15; d is an integer of 0 to 15; c+d is an integer of 1 to 15; and the compound represented by general formula (2) may be a block copolymer or a random copolymer); and an epoxy resin component (B) comprising at least one epoxy resin;

wherein each $R_1$ represents
a divalent organic group selected from the group consisting of the following:

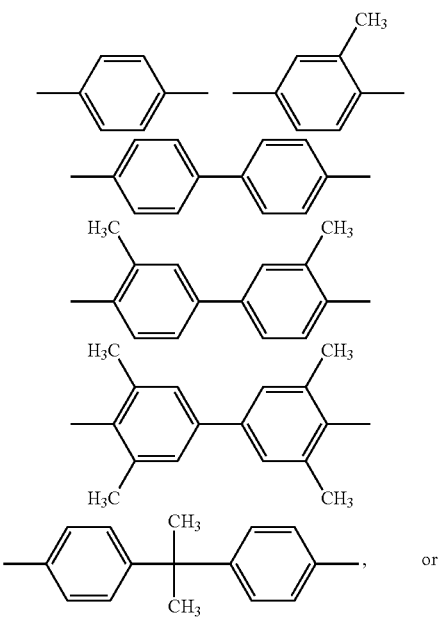

general formula (6):

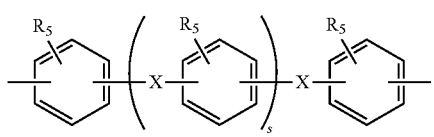

wherein each X independently represents a divalent group selected from the group consisting of —C(=O)—, —SO$_2$—, —O—, —S—, —(CH$_2$)$_L$—, —NHCO—, —C(CH$_3$)$_2$—, —C(CF$_3$)$_2$—, and —C(=O)O—, or a direct bond; each R$_5$ independently represents —OH, —NH$_2$, hydrogen, halogen, or an alkyl group having 1 to 4 carbon atoms; and L and s independently are an integer of 0 to 5.

2. The thermosetting resin composition according to claim 1, further comprising a polyimide resin component (C) containing at least one polyimide resin.

3. The thermosetting resin composition according to claim 2, wherein the mixing ratio by weight of the weight of the polyimide resin component (C) to the total weight of the imide oligomer component (A) and the epoxy resin component (B), (C)/[(A)+(B)], is in the range of 0.1 to 2.0.

4. The thermosetting resin composition according to claim 1, wherein the molar ratio of the number of moles of active hydrogen groups contained in the imide oligomer component (A) to the number of moles of the epoxy groups contained in the epoxy resin component (B), (A)/(B), is in the range of 0.4 to 2.0.

5. The thermosetting resin composition according to claim 1, wherein the weight-average molecular weight of the imide oligomer component (A) is 15,000 or less.

6. A laminate comprising at least one resin layer comprising the thermosetting resin composition according to claim 1.

7. A circuit board comprising the thermosetting resin composition according to claim 1.

8. The thermosetting resin composition according to claim 2, wherein the molar ratio of the number of moles of active hydrogen groups contained in the imide oligomer component (A) to the number of moles of the epoxy groups contained in the epoxy resin component (B), (A)/(B), is in the range of 0.4 to 2.0.

9. The thermosetting resin composition according to claim 3, wherein the molar ratio of the number of moles of active hydrogen groups contained in the imide oligomer component (A) to the number of moles of the epoxy groups contained in the epoxy resin component (B), (A)/(B), is in the range of 0.4 to 2.0.

10. The thermosetting resin composition according to claim 2, wherein the weight-average molecular weight of the imide oligomer component (A) is 15,000 or less.

11. The thermosetting resin composition according to claim 3, wherein the weight-average molecular weight of the imide oligomer component (A) is 15,000 or less.

12. The thermosetting resin composition according to claim 4, wherein the weight-average molecular weight of the imide oligomer component (A) is 15,000 or less.

* * * * *